United States Patent
Cohn et al.

(10) Patent No.: US 6,792,582 B1
(45) Date of Patent: Sep. 14, 2004

(54) CONCURRENT LOGICAL AND PHYSICAL CONSTRUCTION OF VOLTAGE ISLANDS FOR MIXED SUPPLY VOLTAGE DESIGNS

(75) Inventors: John M Cohn, Essex Junction, VT (US); Alvar A. Dean, Groton, MA (US); David J. Hathaway, Underhill Center, VT (US); David E. Lackey, Jericho, VT (US); Thomas M. Lepsic, Jeffersonville, VT (US); Susan K. Lichtensteiger, Essex Junction, VT (US); Scott A. Tetreault, Franklin, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 09/713,829

(22) Filed: Nov. 15, 2000

(51) Int. Cl.[7] .......................... G06F 17/50; G06F 9/45; G06F 7/38; H03K 19/173
(52) U.S. Cl. ...................... 716/7; 716/2; 716/4; 716/9; 326/38
(58) Field of Search .............................. 716/7, 2, 4, 9; 326/38

(56) References Cited

U.S. PATENT DOCUMENTS

| | | | |
|---|---|---|---|
| 4,580,228 A | 4/1986 | Noto ............................. | 716/9 |
| 4,698,760 A | 10/1987 | Lembach et al. .............. | 716/6 |
| 4,745,084 A | 5/1988 | Rowson et al. ................ | 438/129 |
| 4,754,408 A | 6/1988 | Carpenter et al. ............. | 716/9 |
| 4,811,237 A | 3/1989 | Putatunda et al. ............. | 716/9 |
| 4,860,081 A | * 8/1989 | Cogan ........................ | 257/501 |
| 5,313,398 A | * 5/1994 | Rohrer et al. ................. | 703/14 |
| 5,434,436 A | 7/1995 | Taniguchi et al. ........... | 257/202 |
| 5,552,618 A | 9/1996 | Taniguchi et al. .......... | 257/207 |
| 5,780,883 A | 7/1998 | Tran et al. ................... | 257/206 |
| 5,814,845 A | 9/1998 | Carley ......................... | 257/207 |
| 5,926,396 A | 7/1999 | Ohara .......................... | 716/4 |
| 6,225,858 B1 | * 5/2001 | Guardiani et al. .......... | 327/544 |
| 6,417,689 B1 | * 7/2002 | Jain ............................ | 326/38 |
| 6,499,129 B1 | * 12/2002 | Srinivasan et al. ........... | 716/4 |
| 6,501,311 B2 | * 12/2002 | Lutkemeyer ................ | 327/161 |

OTHER PUBLICATIONS

Chingwei Yeh et al., Layout Techniques Supporting the Use of Dual Supply Voltages for Cell–Based Designs, Proceedings of the 36th ACM/IEEE Conference on Design Automation Conference, pp. 62–67, Jun. 1999.*

(List continued on next page.)

*Primary Examiner*—A. M. Thompson
(74) *Attorney, Agent, or Firm*—Richard M. Kotulak

(57) ABSTRACT

Both logical and physical construction of voltage islands is disclosed. A semiconductor chip design is partitioned into "bins", which are areas of the design. In this way, a semiconductor chip design may be "sliced" into various areas and the areas may then be assigned to various voltage levels. Each bin may be thought of as a voltage island. Circuits in the design can be added to or removed from the various bins, thereby increasing or decreasing the speed and power of the circuits: the speed and power increase if a circuit is placed into a bin assigned a higher voltage, and the speed and power decrease if a circuit is placed into a bin having a lower voltage. The size and location of the bins may also be changed. By iterating these steps, the optimum power consumption may be met while still meeting speed constraints and other criteria. The present invention is applicable to any placement environment, such as an annealing placement tool, that proceeds through successive refinement of the locations of the circuits on the design and in which the placement process may be interrupted to make changes in placement of the logic.

61 Claims, 12 Drawing Sheets

OTHER PUBLICATIONS

David Lackey et al., Managing Power and Performance for System–On–Chip Designs Using Voltage islands, ICCAD 2002, IEEE/ACM International Conference on Computer–Adided Design, pp. 195–202, Nov. 2002.*

K. Usami et al., Low–power Design Methodology and Applications Utilizing Dual Supply Voltages, Proceedings of the ASP–DAC Design Automation Conference, pp. 123–128, Jan. 2000.*

K. Usami et al., Design Methodology of Ultra Low–Power MPEG4 Codec Core Exploiting Voltage Scaling Techniques, Proceedings of the 35th Annual Conference on Design Automation Conference, pp. 483–488, May 1998.*

Toshiba Corporation, "A Low–power Design Method Using Multiple Supply Voltages", 1997, pp. 36–41.

ACM/IEEE Conference on Design Automation, $36^{th}$, New Orleans, Jun. 21–25, 1999, Layout Techniques Supporting the Use of Dual Supply Voltages for Cell–based Designs, pp. 62–67.

International Symposium on Circuits and Systems, New Orleans, May 1–3, 1990, "Efficient Techniques for Timing Correction", vol. 1, pp. 415–419.

Toshiba Corporation, Usami, et al., Clustered Voltage Scaling Tchnique for Low–power Design, 1995, pp. 3–8.

IEEE Journal of Solid–State Circuits, vol. 33, No. 3, Mar. 1998, pp. 463–472, "Automated Low Power Technique Exploiting Multiple Supply Voltages Applied to a Media Processor".

* cited by examiner

CONCURRENT LOGICAL AND PHYSICAL CONSTRUCTION OF VOLTAGE ISLANDS FOR MIXED SUPPLY VOLTAGE DESIGNS

BACKGROUND OF THE INVENTION

1. Technical Field

This invention generally relates to computer-aided placement of circuits on a semiconductor chip, and more specifically relates to concurrent logical and physical construction of voltage islands for mixed supply voltage designs.

2. Background Art

The switching power of digital circuits increases as the square of the power supply voltage increases. Thus, reducing this voltage is desirable for reduction in circuit power consumption. However, reduction in power supply voltage also reduces circuit performance. Therefore, it is desirable to combine circuits driven by a higher power supply voltage and circuits driven by a lower power supply voltage (hereafter referred to as high and low voltage circuits, respectively) on the same chip. The high voltage circuits are used where needed to achieve the desired circuit performance and the low voltage circuits are used elsewhere.

When high and low voltage circuits are combined on a semiconductor chip in this way, it is desirable to physically group the low voltage circuits together in low voltage "islands" and to separately group the high voltage circuits together into high voltage "islands". This is preferable because the high and low voltage power supplies are distributed on separate distribution networks and, by grouping the circuits into islands, only one of the two power supplies needs to be distributed within each island. This reduces the amount of extra wiring resource required to distribute the two power supplies, thereby leaving more wiring resource available for signal wiring. Ultimately, this allows the semiconductor chip to be smaller and/or fewer wiring planes to be required.

When high and low voltage circuits are combined on a chip, care must also be taken for nets that are driving signals from one type of circuit to the other. Typically, high voltage circuits can directly drive low voltage circuits with no special intervening circuitry, but low voltage circuits feeding high voltage circuits must drive them through special "level-shifter" circuits. Such circuits add area, power, and delay to the network. Therefore, it is desirable to minimize their use. In many circuit families, high voltage latch circuits can act as level shifters at no additional cost. Thus, if low voltage circuits are selected so that they directly feed latches, the number of level-shifters needed can be reduced. The number of level-shifters needed is typically reduced by assigning groups of closely connected circuits to high or low voltage.

In summary, placing high voltage circuits in high voltage islands and low voltage circuits in low voltage islands typically minimizes the number of level shifters used. This also reduces the number of places to which the high and low voltage power must route, thereby reducing power distribution costs. However, these islands may not be conducive to good logical placement. For example, a signal might have to run quite a long distance to a high voltage island and then from the high voltage island back to circuitry that uses this signal. This could actually decrease performance instead of increasing it. Thus, a poor placement result occurs for what should be a better placement.

Another method used for creating high and low voltage circuits is logical clustering. In logical cluster, the high and low voltage circuits are designed—not in voltage islands—based on connectivity. Elements in a circuit that need to be faster are changed to higher voltage, while slower, non-critical elements are changed to lower voltage. This solves the placement issues caused by high and low voltage island clustering, as the data paths are not moved. However, the different power supplies must be distributed everywhere and logical clustering can tremendously increase the number of level shifters.

Thus, there is a need to limit the amount of power routing and level shifters, yet still allow critical data paths to meet timing requirements.

DISCLOSURE OF THE INVENTION

The preferred embodiments of the present invention solve these problems by providing both logical and physical construction of voltage islands. The preferred embodiments of the present invention combine both physical and logical synthesis to provide fewer level shifters and less power routing, but still meet timing and other requirements. Additionally, by using an iterative process for construction of the voltage islands, power usage can be minimized while speed constraints, in particular, are met.

In one aspect of the present invention, a semiconductor chip design is partitioned into "bins", which are areas of the design. In this way, a semiconductor chip design may be "sliced" into various areas and the areas may then be assigned to various voltage levels. Each bin may be thought of as a voltage island. Circuits in the design can be added to or removed from the various bins, thereby increasing or decreasing the speed and power of the circuits: the speed and power increase if a circuit is placed into a bin assigned a higher voltage, and the speed and power decrease if a circuit is placed into a bin having a lower voltage. The size and location of the bins may also be changed. By iterating these steps, the optimum power consumption may be met while still meeting speed constraints and other criteria.

Thus, instead of solely adding circuits to a voltage island, or solely determining which circuits need higher voltage and changing these circuits to higher voltage levels, the present invention combines these two concepts. The present invention uses both physical and logical construction of voltage islands to meet predetermined criteria.

Dividing a semiconductor chip design into a number of bins is only one way of placing circuits in a design. The present invention is applicable to any placement environment that proceeds through successive refinement of the locations of the circuits on the design and in which the placement process may be interrupted to make changes in placement of the logic.

The foregoing and other features and advantages of the present invention will be apparent from the following more particular description of the preferred embodiment of the invention, as illustrated in the accompanying drawings.

BEST MODE(S) FOR CARRYING OUT THE INVENTION

Figure 1:
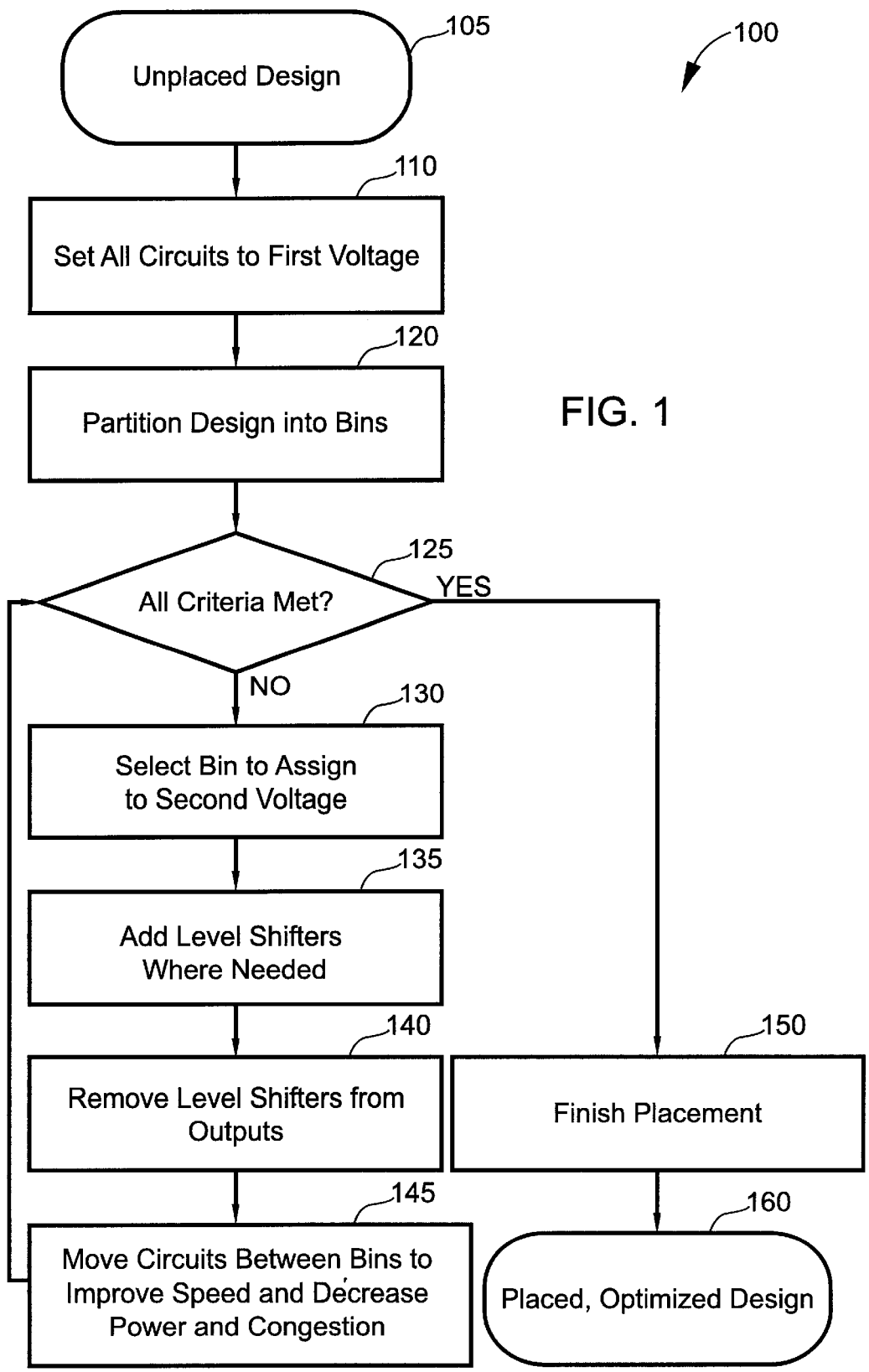
FIG. 1 is a preferred method for providing both logical and physical construction of voltage islands in accordance with the most preferred embodiment of the present invention.

As stated previously, the present invention relates to computer-aided placement of circuits on a semiconductor chip. For those not familiar with this topic, the following Overview section briefly introduces some of the concepts associated with placement processes. Those skilled in the art of computer-aided placement of circuits on a semiconductor chip may wish to proceed directly to the Detailed Description.

Overview

When a semiconductor chip is designed, computer design tools are used. These tools work on and produce a file called a "netlist." This netlist contains a description of all of the gates and the connections between them. A semiconductor chip designer generally works with a simulated logical layout of the chip. In other words, the semiconductor chip will perform some function, and the designer ensures that the simulated chip actually logically performs the function. When the actual chip is ready to be made, chip designers use a placement tool that takes the original netlist and creates an output. The placement tool is given the netlist, timing constraints, placement constraints, and switching information. Additionally, it will also be given libraries that describe the timing of the wire and the gates and that contain the rules of placement, the size and shapes of the gates, etc. The placement tool outputs a modified netlist and placement information. These are then fed into a wiring tool that generates the masks and other information used to actually create the chip on a semiconductor wafer.

There are several different types of placement systems. One important system is called Placement Driven Synthesis, or PDS. A reference for PDS is "An Integrated Placement and Synthesis Approach for Timing Closure of the POWER PC Microprocessor", S. Hojat and D. Villarrubia, pages 206 to 210, International Conference on Computer Design, 1997, which is incorporated herein by reference. A PDS system allows logical changes to a network to be made during placement. PDS consists of a cut-based placement program and a set of operations to be performed between cuts. A cut-based placement program will recursively divide the chip area and the circuits on the chip. Generally, it starts by dividing the chip in two (though quadrisection methods, which divide the chip into four parts, are also known), then divides each of these halves in two, and so on. At first, nothing is known about the eventual location of circuits on the chip, and after each set of cuts the circuit locations are refined.

The regions into which the chip has been divided at any point in the placement process are referred to as "bins". In PDS, various "logic synthesis" actions (generally any program which modifies the netlist) are performed between sets of placement cuts, allowing modifications to be made to the network based on the refined knowledge of circuit placement now available. Typical actions include buffering, cloning (duplicating a circuit and distributing its fanout between the original circuit and the copy), factoring, pin swapping, etc. Occasionally, circuits are also moved between bins.

Another example of a placement tool and methodology is a simulated annealing placer. Such a placement tool operates by analogy with the physical annealing of a crystal, making many trial changes to the placement. Each of these trial changes may be kept or undone depending on the improvement it makes to some metric of the "goodness" of the placement (e.g., estimated wire congestion) and a "temperature" variable which helps to control the annealing process. The process begins at a high temperature and proceeds to a low temperature as the placement progresses. Changes which improve the metric are always kept while changes which degrade the metric have a probability of being kept, which decreases as the temperature decreases and as the amount of degradation of the placement metric increases. As placement progresses, the average distance a circuit is moved in an accepted placement change decreases. Thus, the locations of circuits on the chip are progressively better known.

Detailed Description

The preferred embodiments of the present invention combine both physical and logical synthesis to provide fewer level shifters and less power routing, but still meet timing and other requirements. Additionally, by using an iterative process for construction of the voltage islands, power usage can be minimized while speed constraints, in particular, are met.

In one aspect of the present invention, a semiconductor chip design is partitioned into "bins", which are areas of the design. In this way, a semiconductor chip design may be "sliced" into various areas and the areas may then be assigned to various voltage levels. Each bin may be thought of as a voltage island. Circuits in the design can be added to or removed from the various bins, thereby increasing or decreasing the speed and power of the circuits: the speed and power increase if a circuit is placed into a bin assigned a higher voltage, and the speed and power decrease if a circuit is placed into a bin having a lower voltage. The size and location of the bins may also be changed. By iterating these steps, the optimum power consumption may be met while still meeting speed constraints and other criteria.

Thus, instead of solely adding circuits to a voltage island, or solely determining which circuits need higher voltage and changing these circuits to higher voltage levels, the present invention combines these two concepts. The present invention uses both physical and logical construction of voltage islands to meet predetermined criteria.

Dividing a semiconductor chip design into a number of bins is only one way of placing circuits in a design. The present invention is applicable to any placement environment that proceeds through successive refinement of the locations of the circuits on the design and in which the placement process may be interrupted to make changes in placement of the logic.

Before proceeding with more discussion of the preferred embodiments, it is beneficial to discuss terminology. As used herein, a "bin" is an area of a design of a semiconductor chip. Each bin is not necessarily assigned to a particular voltage. A voltage island is also an area of the design that is assigned to a particular voltage. All circuits in the voltage island will be powered by the particular voltage to which the voltage island is assigned.

Any placement system may be used to perform both physical and logical synthesis as disclosed herein. Such a placement system, in general, would assign a set of circuits on a portion of a chip design to a particular voltage level, select an area of the chip design, and assign circuits within the area to a different voltage level. Movement of circuits would occur between the higher and lower (or intermediate) voltage levels to optimize the design. In the most preferred embodiment of the present invention, a chip design is sliced into bins. Each bin will be a voltage island and assigned to a particular voltage. Some of the bins will be assigned a higher voltage and some will be assigned a lower voltage. Thus, physical synthesis is performed. Within these physical constraints, circuits are moved from areas of higher voltage to areas of lower voltage, or vice versa, to meet power, speed, and other criteria. Thus, logical synthesis is also performed. In another embodiment of the present invention, an annealing placement system is used. In this version, voltage islands will be assigned to particular locations and bins will not be used. Physical and logical synthesis will still occur.

Figure 12:
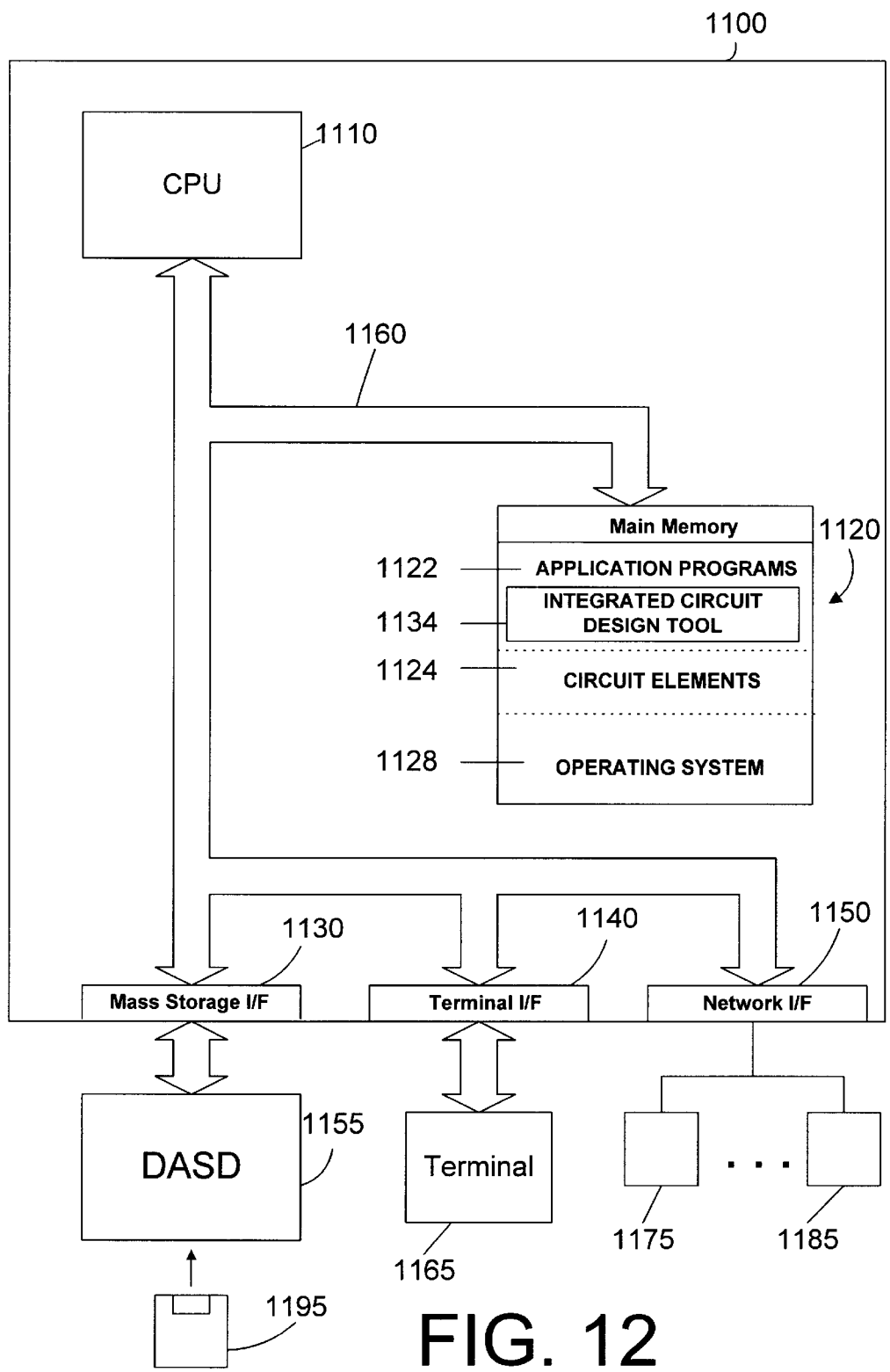
FIG. 12 illustrates a block diagram of the computer system of the present invention.

Turning now to FIG. 12, FIG. 12 illustrates a block diagram of the computer system of the present invention. Those skilled in the art will appreciate that the mechanisms and apparatus of the present invention apply equally to any computer system, regardless whether the computer system is a complicated multi-user computing apparatus or a single user workstation. As shown in the exploded view of FIG. 1, computer system 1100 comprises a main or central processing unit (CPU) 1110 connected to a main memory 1120, a mass storage interface 1130, a terminal interface 1140, and a network interface 1150. These system components are interconnected through the use of a system bus 1160. Mass storage interface 1130 is used to connect mass storage devices (such as DASD device 1155) to computer system 1100. One specific type of DASD device is a floppy disk drive, which may store data to and read data from a floppy diskette 1195.

Main memory 1120 contains one or more application programs 1122, circuit elements 1124, data 1126, and an operating system 1128. Computer system 1100 utilizes well known virtual addressing mechanisms that allow the programs of computer system 1100 to behave as if they only have access to a large, single storage entity instead of access to multiple, smaller storage entities such as main memory 1120 and DASD device 1155. Therefore, while application programs 1122, circuit elements 1124, data 1126, and operating system 1128 are shown to reside in main memory 1120, those skilled in the art will recognize that these are not necessarily all completely contained in main memory 1120 at the same time. (It should also be noted that the term "computer system memory" is used herein to generically refer to the entire virtual memory of computer system 100.)

Operating system 1128 is any suitable operating system. Those skilled in the art will appreciate that the spirit and scope of the present invention is not limited to any one operating system. Also residing in main memory 1120 are one or more application programs 1122 that are executed by CPU 1110. One of these application programs is an integrated circuit design tool 1134 in accordance with the present invention. Also included within main memory 1120 are representations (e.g., electrical and timing parameters) of circuit elements 1124 that are used by design tool 1134. While integrated circuit design tool 1134 and circuit elements 1124 are shown residing in main memory 1120, they may exist anywhere in the virtual memory space of computer 1100. In addition, while circuit elements 1124 are shown separate from design tool 1134, these circuit elements 1124 could also be provided as an integral part of integrated circuit design tool 1134. As will be discussed in greater detail below, integrated circuit design tool 1134 is preferably a design tool that performs Placement Driven Synthesis (PDS) of circuit elements 1124. As stated in the Overview section, PDS slices a chip design into relatively small areas called bins. In this most preferred embodiment, the bins are used as voltage islands and criteria are used to determine when the design has been properly placed.

Although computer system 1100 is shown to contain only a single main CPU and a single system bus, those skilled in the art will appreciate that the present invention may be practiced using a computer system that has multiple CPUs and/or multiple buses. In addition, the interfaces that are used in the preferred embodiment each include separate, fully programmed microprocessors that are used to off-load compute-intensive processing from CPU 1110. However, those skilled in the art will appreciate that the present invention applies equally to computer systems that simply use I/O adapters to perform similar functions.

Terminal interface 1140 is used to directly connect one or more terminals 1165 to computer system 1100. These terminals 1165, which may be non-intelligent or fully programmable workstations, are used to allow system administrators and users to communicate with computer system 1100.

Network interface 1150 is used to connect other computer systems and/or workstations (e.g., 1175 and 1185 in FIG. 1) to computer system 1100 in networked fashion. The present invention applies regardless of whether network interface 1150 is present or not. For the purposes of the preferred embodiment herein, network interface 1150 is present, and the present invention applies equally no matter how computer system 1100 may be connected to other computer systems and/or workstations, regardless of whether the connection(s) is made using present-day analog and/or digital techniques or via some networking mechanism of the future. It is also important to point out that the presence of network interface 1150 within computer system 1100 means that computer system 1100 may engage in cooperative processing with one or more other computer systems or workstations. Of course, this in turn means that the programs shown in main memory 1120 need not necessarily all reside on computer system 1100. For example, one or more programs of application programs 1122 may reside on another system and engage in cooperative processing with one or more programs that reside on computer system 1100. This cooperative processing could be accomplished through use of one of the well known client-server mechanisms such as remote procedure call (RPC).

At this point, it is important to note that while the present invention has been (and will continue to be) described in the context of a fully functional computer system, those skilled in the art will appreciate that the present invention is capable of being distributed as a program product in a variety of forms, and that the present invention applies equally regardless of the particular type of signal bearing media to actually carry out the distribution. Examples of signal bearing media include: recordable type media such as floppy disks (e.g., disk 1195 of FIG. 1) and CD ROMS, and transmission type media such as digital and analog communication links, including wireless communication links.

Turning now to FIG. 1, a method is shown for placing circuits using both physical and logical construction of voltage islands. Method 100 is preferably preformed by integrated circuit design tool 1134 as illustrated in FIG. 12. Method 100, when performed by integrated circuit design tool 1134 during circuit element placement, will facilitate circuit element placement results in the best combination of power and speed, and to meet other criteria.

Method 100 Begins when the unplaced design 105 is given to the placement tool. The unplaced design is described by a netlist, which is description of all of the gates and the connections between them. Along with the unplaced design, the tool is also given a set of timing constraints and/or power and area constraints. Also, as some circuits need to be in a certain location (such as input/output circuits), there may also need to be some location constraints. Finally, the placement tool is given libraries that describe the timing of the wire and the gates, and that contain the rules of placement, the size and shape of the gates, etc.

Initially, all circuits are set to a particular voltage (step 110). Preferably, all circuits will be set to a low voltage, as this tends to decrease the overall power requirements. If the circuits are initially set to a higher voltage, the circuits are already higher power and the placed design tends to be higher in power. If more than two voltages are used, then it is recommended that the lowest voltage be chosen in this step. If two (high and low) voltages are used, the low voltage should be chosen as the starting voltage for the voltage islands.

In step 120, the unplaced design is partitioned into bins. In method 100, each bin and voltage island should be equivalent. In other words, each voltage island will be one bin. During this partitioning (or "cutting") process, normal PDS synthesis actions will be used to try to meet performance objectives, to reduce power by other means than voltage island creation, and to meet other design objectives. In particular, a PDS system could consider global routing constraints at this juncture. If voltage islands are too small, the amount of power routing increases. This can have a deleterious effect on system space considerations.

In step 125, a decision is made as to whether all design criteria are met. Normally, the design criteria will primarily be a combination of performance and power. For instance, the design criteria could be minimizing power subject to a performance constraint. For these criteria, the performance constraint must be met, and various placement designs that meet the performance criteria can result in different power consumption. One way of judging performance is through "slacks." Slack is the amount of time between when a signal absolutely must be at a location and when it actually gets there. If there is a positive slack, the signal arrived before it had to. It might be possible to make one or more circuits in the path be lower power. On the other hand, if there is a negative slack, the signal did not arrive in time. Generally, this means that changing one or more circuits in the path to higher power could increase the performance. For the criteria of minimizing power subject to a performance constraint, meeting these design criteria means that all performance objectives are met (i.e., all slacks are positive) and the placed design has the lowest power of possible design placements.

If the design criteria are maximizing performance subject to a power constraint, meeting these criteria means that assignment of high voltage to any more bins will cause the power constraint to be exceeded.

It should be noted that criteria other than power and performance may be tested in step 125. For example, location is important for some circuits, such as input/output circuits. Meeting the criteria in step 125 can entail ensuring that these circuits are in the proper location. Additionally, area, noise, reliability, and wire-ability are other criteria that may be tested in step 125.

If the design criteria are met (step 125=YES), then placement is finished in step 150. In this step, the PDS system is given that constraint that no circuits may be transferred from low voltage bins to high voltage bins and vice versa. During this step, the modified netlist and placement information are output. Prior to outputting the placement information, the PDS system will determine exact locations for each circuit within each bin so as to create the placement information. Preferably, in previous steps, circuits are simply placed into particular bins. During step 150, the exact X,Y location of each circuit within a bin is determined. Once the modified netlist and placement information are output, the design is placed and optimized (step 160). The design may be transferred to a wiring tool to create the masks, etc., needed to actually make the chip.

If one or more of the criteria are not met (step 125=NO), in step 130, the PDS system assigns a bin to a second voltage. The selected bin will become a voltage island at the second voltage. Preferably, the second voltage is higher than the first voltage. If two voltages, low and high, are used, most preferably a bin is assigned to a high voltage. If more than two voltages are used, then preferably the next highest voltage is assigned to a bin. For example, if there are three voltages (low, medium, and high), preferably a bin will be initially assigned to the medium voltage. On the second pass through step 125, this same bin can then, if slack for circuits in the bin is still negative for instance, be assigned to the high voltage. Assigning bins to increasing voltage, from low to high, generally results in a placed design that is lower in power than could be achieved by assigning bins to decreasing voltage (from high to low).

In step 130, a particular bin is also selected as the bin to assign to the second voltage. There are many ways to determine which bin to assign to the second voltage. When the second voltage is a higher voltage, generally the selected bin will be a bin containing circuits on the worst slack path in the design. In this scenario, increasing voltage will increase the speed of the circuits, thereby improving the slack. The selected bin may also be chosen at random. Another method for selecting bins (when the second voltage is a high voltage) is to select low switching bins, which contain nets that are not used much or circuits that switch relatively few times. The prior method reduces power because increased switching equates with increased power.

Alternatively, the determination of which bin to assign to the second voltage could entail trying to find points where many late paths converge. Methods for finding such points are described in the following, which are incorporated herein by reference: K. Usami, et al., "Automated Low-Power Technique Exploiting Multiple Supply Voltages Applied to a Media Processor", Institute of Electrical and Electronics Engineers Journal of Solid-State Circuits, v. 33, no. 3, 463–472 (March, 1998); and L. Berman, et al., "Efficient Techniques for Timing Correction", Proceeding of the 1990 International Symposium on Circuits and Systems (May 1990).

Additionally, a selected bin could be a bin having large numbers of circuits in critical paths. For this selection, the bin with the largest number of circuits in the critical paths may be selected as the bin. Alternatively, the selection could be made by determining which bin will cause the largest delay improvement to critical paths if the circuits the bin contains are assigned to the second (higher) voltage. Finally, the bin selection could be made by choosing a bin that has a large number of inputs directly feeding latches, as such a bin will reduce the need for level-shifters.

It should be noted that multiple bins may be selected in step 130. However, for simplicity, the selection of only one bin will be discussed herein. Also, in step 130, the selected bin and its circuitry will be assigned to the second voltage. Assigning circuitry to the second voltage allows the PDS tool to recalculated delays, power consumption, slack, and other data. This information is then used to determine if criteria are met.

In step 135, level shifters are added where needed. If the second voltage is a higher voltage, the selected bin will be converted to a high voltage island. Low voltage circuits that output signals to circuits in the high voltage island (the selected bin) will have level shifters added to the low voltage signals. If the second voltage is a lower voltage, then level shifters might not be needed between circuits in a high voltage island and circuits in a low voltage island. This is true because, in general, low voltage circuits need level shifters to feed high voltage circuits but high voltage circuits do not necessarily need level shifters to feed low voltage circuits.

In step 140, level shifters are removed from the outputs of circuits that no longer need the level shifters. For example, if a low voltage circuit had an output signal that fed a high voltage circuit, the output signal for the low voltage circuit would have a level shifter on it. When the bin containing this low voltage circuit is made into a high or higher voltage island, the level shifter is no longer needed on the output of the low voltage circuit.

In step 145, circuits are moved between bins to improve speed and decrease power and congestion. Circuits may be moved into a selected bin to increase speed (if the selected bin is a higher voltage bin), increase occupancy, or to make room in adjacent bins. Circuits may be moved out of the selected bin to decrease power (if the selected bin is a higher voltage bin and the circuits are moved into a lower voltage bin), decrease congestion, decrease occupancy, or increase the surrounding bin occupancy.

Figure 2:
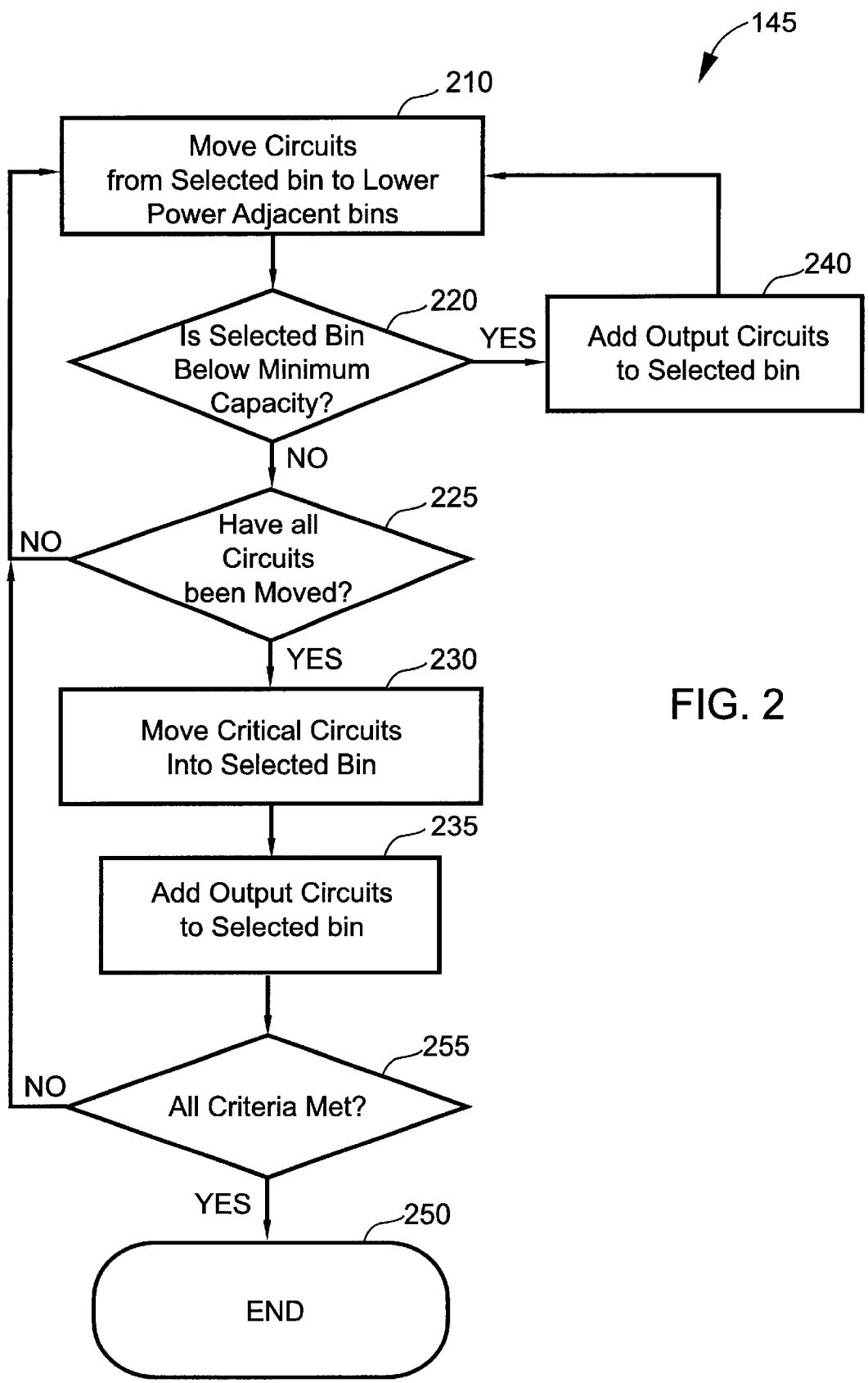
FIG. 2 is a preferred method for moving circuits between bins to improve speed and decrease power and congestion.

Referring now to FIG. 2 in addition to FIG. 1, FIG. 2 describes step 145 more particularly. Step 145 in this example is written such that the selected bin is high or higher voltage and some surrounding bins are lower voltage. Differences between this situation and the opposite situation, which is when the selected bin is lower voltage and some of the surrounding bins are higher voltage, will be discussed after the description of FIG. 2. It should be noted that, even though steps are shown in a particular order in methods 145 and 100, the steps do not necessarily have to be performed in this order.

After each step or operation of method 145, the circuits can be checked to see if they violate timing limits, violate any bin capacities, or violate any congestion limits on cut lines between bins. If so, the operation can be rejected. Timing limits may be violated due to increased loading on nets brought about by changes in wire length caused by the circuit movement. Bin capacities can be violated if too many circuits are placed into a bin, such that the circuits and connecting wiring simply cannot fit into the area of the bin. Note that different semiconductor technologies may have different area requirements for circuitry. Congestion limits may be violated if there are too many wires because of too many data paths going into the bin. If there are too many data paths going into a bin, the bin will not be wire-able In method 145, circuit movements may also include cloning of circuits to reduce the impact on net length.

Still referring to FIG. 2, method 145 begins when non-critical circuits are moved from the selected bin to lower power adjacent bins (step 210). Critical paths need to meet certain timing requirements and also tend to be the hardest to meet tuning on. The PDS system performs a timing analysis and, from this analysis, determines which paths arm critical. A non-critical circuit is a circuit that is not in a critical path. Conversely, a critical circuit is a circuit in a critical path. Step 210 lowers power by moving non-critical circuits to lower power voltage islands. If necessary, level shifters on the outputs of these noncritical circuits are moved to their inputs. For this step, it is possible to preferentially choose circuits in the selected bin that are sourcing bin outputs that feed circuits in other low voltage bins.

Additionally in step 210, it is possible to preferentially choose circuits in the selected bin that are fed by circuits in other low voltage bins. To reduce the number of level shifters required, max-flow, min-cut procedure may be performed A reference describing a max-flow, min-cut procedure is "Graph Algoriths", Shimon Even, Computer Science Press, 1979, which is herein incorporated by reference In this procedure, a flow graph would be constructed from the set of all non-critical bin inputs on the selected high voltage bin that is fed by circuits in other low voltage bins and from the noncritical circuits in the selected bin's fan-out cones. A min-cut through the flow network would be determined. All circuits that are to the "left" of the nets in a min-cut through this flow network would be determined Moving these "left" or "feeding" circuits to adjacent low voltage bins would then minimize the number of level-shifters required at the bin inputs. Essentially, this procedure attempts to create the least number of signals transitioning from low voltage to high voltage and minimizes wire length. The flow graph is one way of determining which circuits should be moved to low voltage.

Step 210 may also preferably move high switching circuits out of the bin. High switching circuits are those circuits that switch a relatively high amount of times. This relatively high amount of switching bums more power. Thus, a way of reducing power is to remove high switching circuits from high voltage bins to lower voltage bins. Note that if the circuits are in critical paths, the circuits would preferably remain in the high voltage bin even if they are high switching circuits.

In step 220, if the selected bin drops below minimum capacity (step 220=YES), then low voltage circuits fed by outputs of the circuits in the selected bin will be added to the selected bin (step 240). Circuits to move in this manner would preferentially be chosen to minimize the number of level shifter additions required because these circuits could be along inputs that need level shifters. This step attempts to keep the critical nets at the fastest speed by adding circuitry fed by the critical nets to the higher voltage bin. Thus, when the selected bin's size becomes small, the circuits that are fed by critical nets and that are in lower power bins are added to the higher power selected bin, and the noncritical circuits are removed from the selected bin. Alternatively, this step can entail adding low switching circuits from surrounding areas into the selected bin. This minimizes power, yet increases capacity of the selected bin.

If the selected bin does not drop below minimum capacity (step 220=NO), a determination is made as to whether all non-critical circuits have been moved out (step 225). If not (step 225=NO), then the method proceeds back to step 210. If all non-critical circuits have been moved (step 225=YES), then critical circuits in low voltage bins that feed critical circuits in the selected bin are moved into the selected bin (step 230). Thus, if the critical circuits in the selected bin are still not meeting timing limitations, the circuits feeding these critical circuits are moved from low power to high power. This should speed the critical path and improve timing. Level shifters, if any, will be moved from the outputs of the newly added circuits to the inputs of the newly added circuits.

In step 235, if the selected bin falls below minimum capacity, then low voltage circuits fed by outputs of the critical circuits in the selected bin will be added to the selected bin. Step 235 is similar to step 240. Circuits to move in this manner would preferentially be chosen to minimize the number of level shifter additions required. Step 235 attempts to keep the critical nets at the fastest speed by adding circuitry fed by the critical nets to the higher voltage bin. Thus, when the selected bin's size becomes small, the circuits that are fed by critical nets and that are in lower power bins are added to the higher power, selected bin and the non-critical circuits are removed from the selected bin.

Additionally, in step 235, it may be necessary to make room in adjacent bins for circuits being moved out of the selected bin. To allow this to happen, low voltage circuits fed by outputs of the critical circuits in the selected bin will be added to the selected bin. Again, circuits to move in this manner would preferentially be chosen to minimize the number of level shifter additions required.

In step 255, it is determined as to whether all criteria are met for this bin. Such criteria will primarily be performance and power criteria, according to the performance and power criteria set for the chip design. Additionally, other criteria may be checked, such as over- or under-capacity, routing or location specifications, etc. If all criteria are not met (step 255=NO), method 145 is performed again; if all criteria are met (step 255=YES), the method ends in step 250. It should be noted that even though performance and power criteria could be met prior to step 255, method 145 may be performed multiple times to reduce power to the maximum extent while still meeting the other criteria. The lowest power configuration that meets the other criteria (and, in particular, the performance criteria) would then be the best solution.

It should be noted that method 145 may contain all of the steps shown in FIG. 2 or may only contain some of the steps shown. For example, only step 210 might be used for method 145. Preferably, all steps would be used, as this provides the most performance at the least amount of power. Additionally, if any of the steps of method 145 increases congestion beyond a predetermined level, circuits can be moved between bins to reduce the congestion.

Method 145 as shown in FIG. 2 is applicable any time that the selected bin is assigned to higher voltage than an adjacent bin. If the selected bin is lower voltage and the adjacent bins are higher voltage, method 145 would be slightly different. In this embodiment, it would be more beneficial in step 210 to move non-critical circuits from adjacent bins into the selected bin and to move critical circuits out of the selected bin. In step 240, output circuits that are non-critical are preferentially moved into the selected bin. This is same for steps 230 and 235: Essentially, non-critical circuits from surrounding, higher power bins are moved into the lower power bin.

After step 145 of method 100, step 125 of method 100 is performed again. Method 100 continues until the criteria have been met or until the method does not converge. Generally, the latter is set as a time limit: if the method exceeds a particular time, then it is assumed that the method is not converging to a solution. This could happen, for example, if too low of power criteria are chosen for too high of performance criteria.

Figure 3:
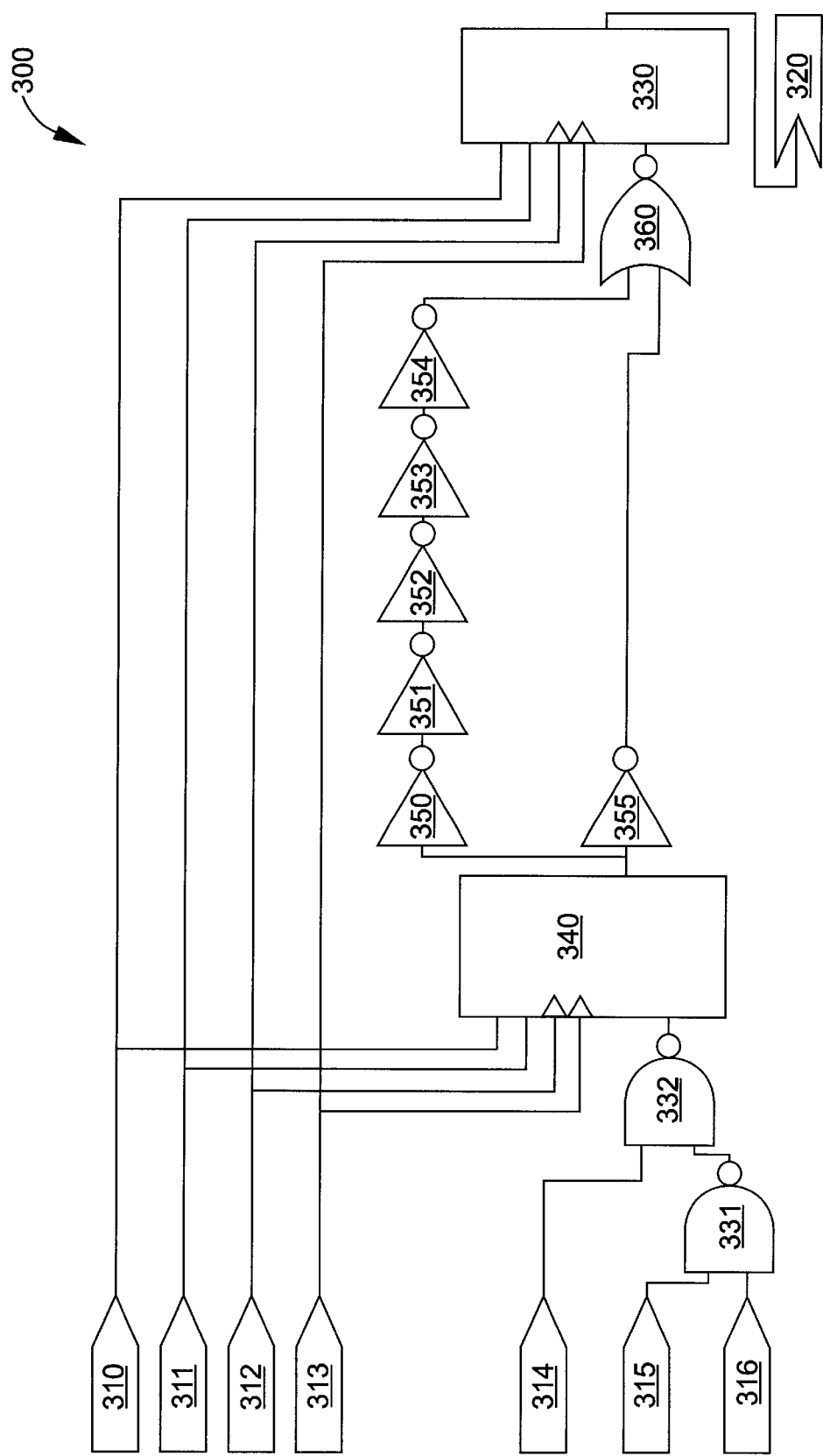
FIGS. 3 through 7 are examples of a logic circuit in various stages of placement in accordance with the method of FIG. 1.
Figure 4:
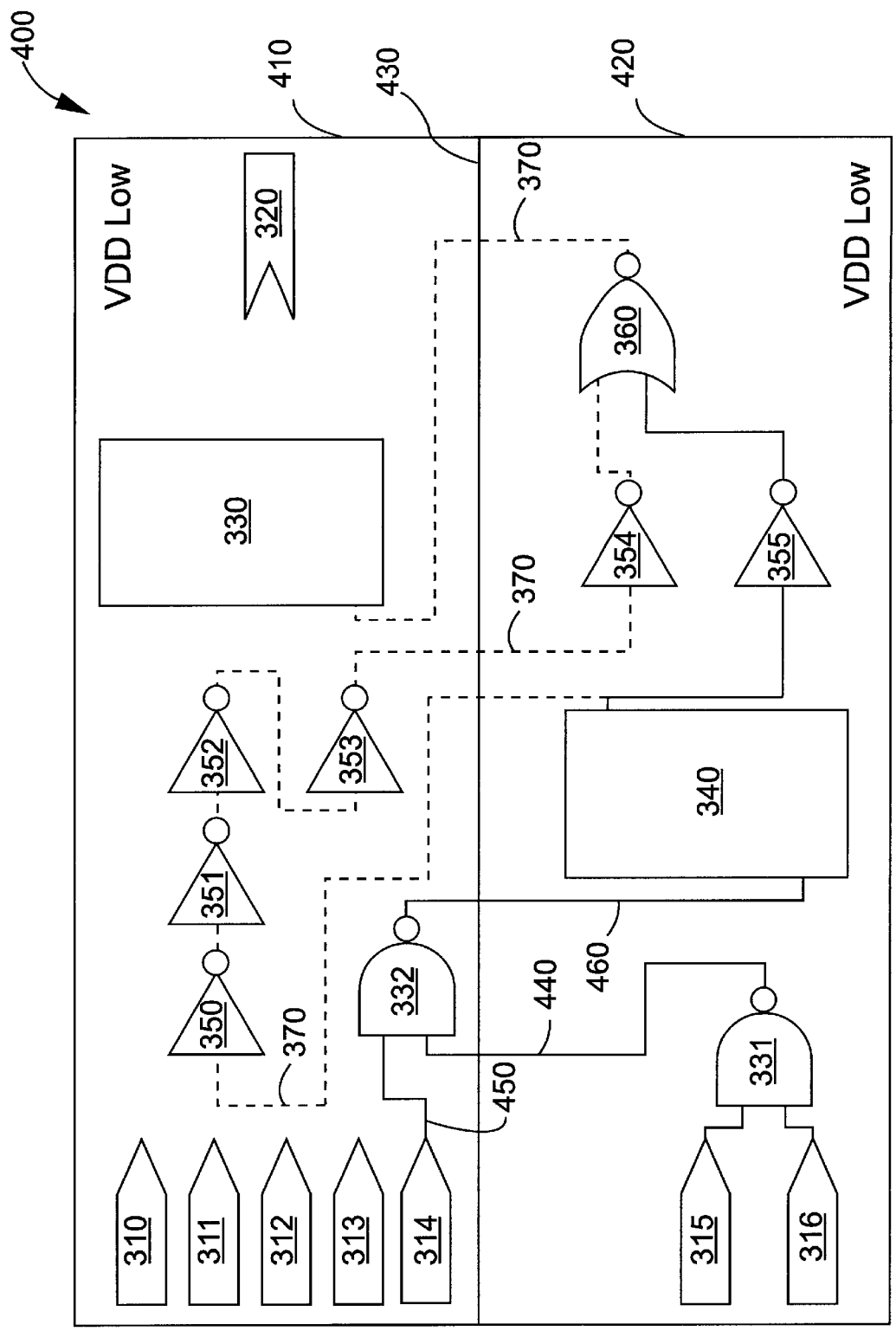

Turning now to FIGS. 3 through 7 in addition to FIGS. 1 and 2, FIGS. 3 through 7 show an exemplary section of a chip design. FIG. 3 shows a completely unplaced chip design, as such a design would exist in step 105 of method 100. FIGS. 4 though 7 show the same chip design at various stages of the placement process of methods 100 and 145.

In FIG. 3, a completely unplaced chip design is shown. Unplaced chip design 300 comprises various inputs 310, 311, 312, 313, 314, 315, and 316 and an output 320. Unplaced chip design 300 also comprises a number of circuits: several NAND gates 331, 332, logic blocks 340 and 330, a number of inverters 350, 351, 352, 353, 354, and 355, and a NOR gate 360. Unplaced chip design 300 is described by a netlist.

In FIG. 4, a partially placed design 400 is shown. Only some of the interconnections are shown. Partially placed design 400 is shown after steps 110 and 120 of method 100. Each bin has been set to low voltage, thereby creating low voltage bin/islands 410 and 420. Boundary 430 separates the two islands 410, 420. In step 120, normal PDS synthesis actions will be used to try to meet performance objectives, to reduce power by other means than voltage island creation, and to meet other design objectives. This results in the partially placed design 400 shown in FIG. 4. Path 370 is a critical path, and nets 440 and 460 cross boundary 430.

Figure 5:
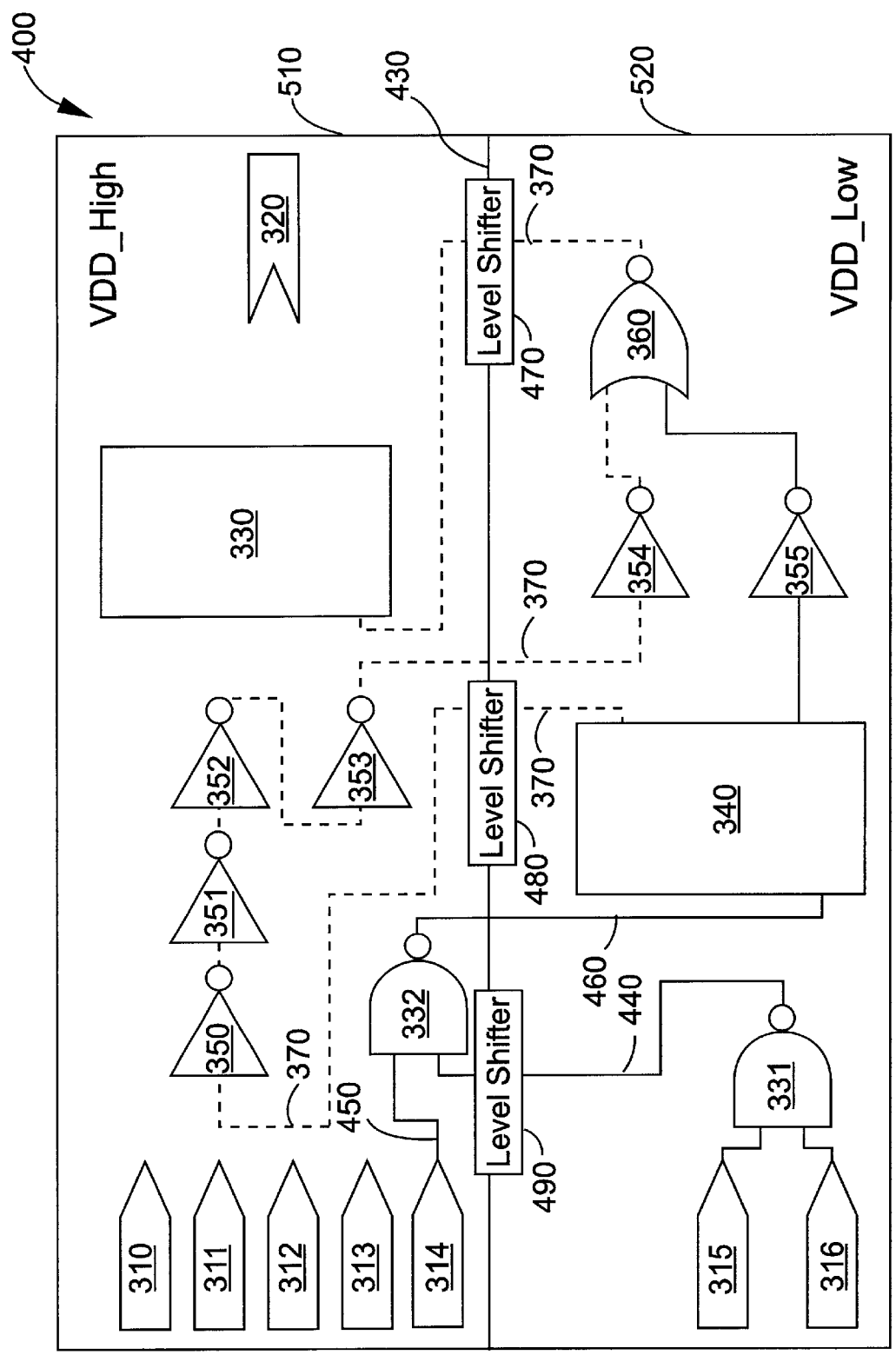

In FIG. 5, bin 410 has been assigned to a high voltage bin/island 510. In step 125, all criteria were not met (step 125=NO), so bin 510 was selected as a high voltage bin in step 130. Bin 520 (420 in FIG. 4) has been unchanged and is still a low voltage bin. All circuits in bin 510 were assigned to higher voltage. Bin 510 was selected as a high voltage bin because it had the most circuits on the worst slack path (path 370) in this small design (step 130 of method 100). Level shifters 470, 480, and 490 were added to nets 370, 370 and 440, respectively, to shift these signals to higher voltage (step 135). Level shifters were not added to net 460 and path 370 as it leaves inverter 353 and travels to inverter 354 because these are high voltage signals. These signals should be able to drive low voltage circuits. In step 140, no level shifters were removed.

The partially placed design 400 can be checked after any of these steps to determine if power, performance, and other criteria are met. In the case of bin or high voltage island 510, net congestion is fairly high; inputs 310 through 314 require quite a bit of wiring on one side of the bin. Additionally, a non-critical circuit (NAND gate 332) and non-critical nets 450, 440, and 460 are in the high voltage bin 510. Moreover, it can be assumed that critical path 370 either does not meet timing requirements, meaning that slack is negative.

Figure 6:
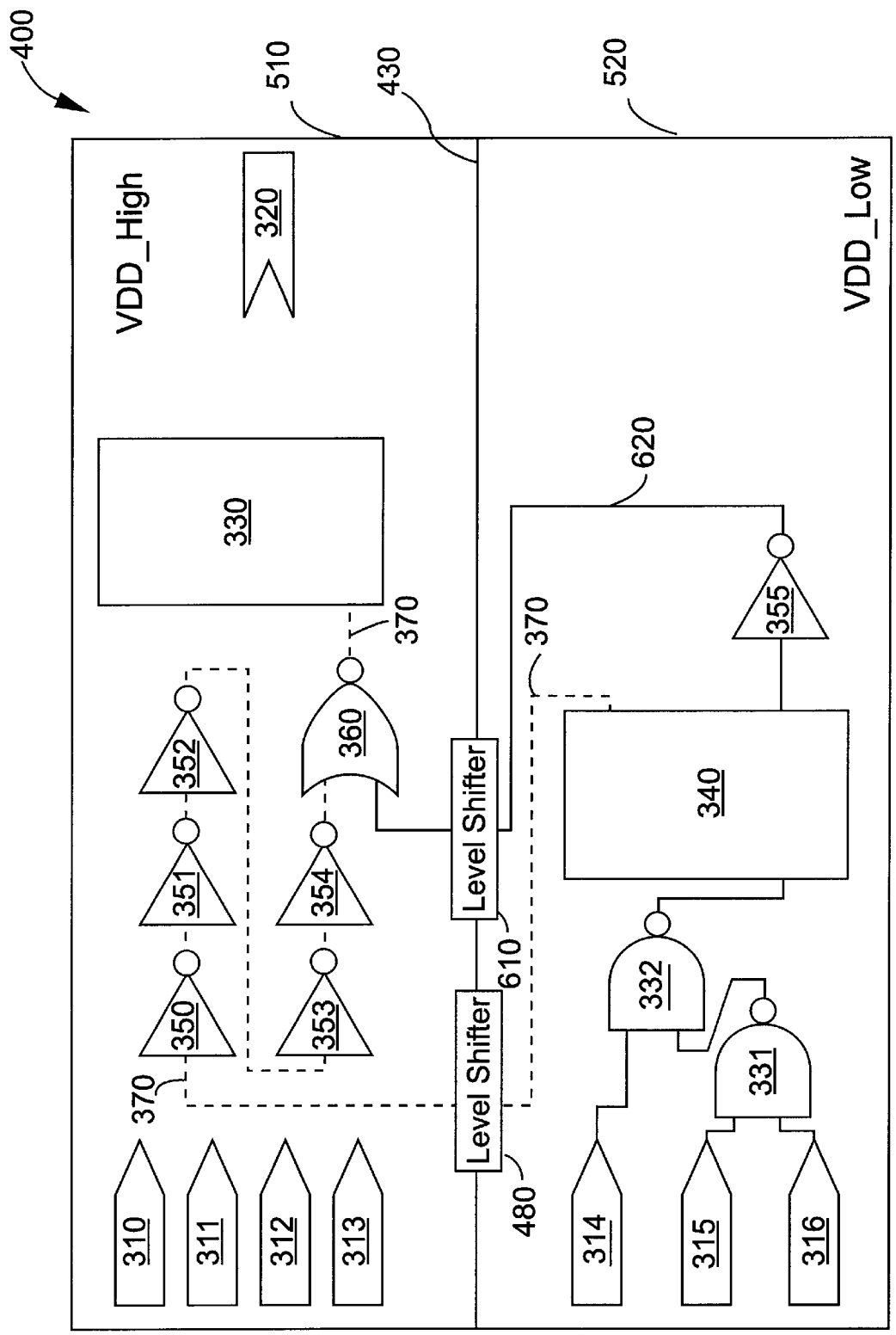

FIGS. 5 and 6 should be referred to during the following description of the sequence of steps of method 145 of FIG. 2. Because bin 510 is not optimized, in step 210 of method 145, input 314, circuit 332, and nets 440, 460, and 450 are moved into low voltage bin/island 520. Level shifter 490 is no longer needed and is removed. In step 220, the selected bin is not below minimum capacity, and in step 224, all of the low voltage circuits have been moved. In step 230, critical circuits 354 and 360 are moved into high voltage bin/island 510. Level shifter 470 is no longer needed, but level shifter 610 is added to increase the voltage from net 620.

Figure 7:
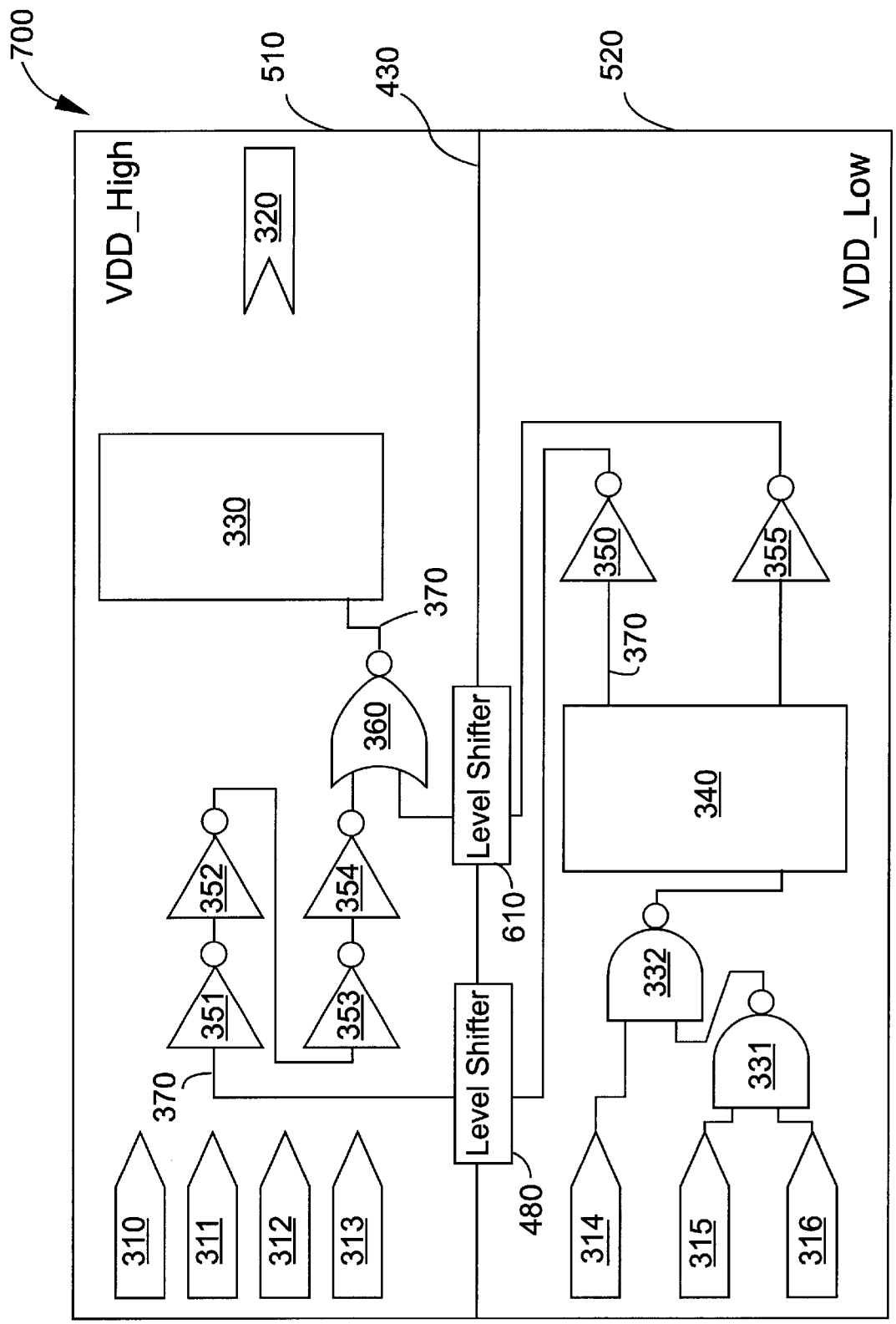

Power and performance criteria are determined in step 255. In this example, it can be assumed that the power and performance criteria are met. However, method 145 may also be made to iterate a predetermined number of time in order to ascertain whether a better combination of power and performance may be created through a different placement. Referring to FIGS. 6 and 7 in addition to FIGS. 1 and 2, after iterating through method 145, the result is placed design 700 of FIG. 7. It should be noted that the placement of in FIG. 6 of critical path 370 has made the slack in this path positive. Because it meets timing requirements, the path 370 is no longer critical in FIG. 7. However, any changes to this path should be checked to determine compliance with timing. In step 210, critical circuit 350 was moved from high voltage bin/island 510 to low voltage bin/island 520. This result has the lowest number of level shifters and the lowest power, while still meeting the performance criteria. During this iterative process, critical circuits 351, 352, etc. were also have been moved from bin 510 to bin 520. However, performance was not met. Thus placed design 700 meets performance and power criteria. If power is less of a criteria, then circuit 350 and perhaps circuit 340 might be added to high voltage bin 510 (assuming that capacity requirements are not violated).

After step 145, additional bins will be selected and optimized in steps 125 through 145, until the entire design is optimized. In the simple example of FIG. 7, bin 520 could be assigned to high voltage. This would provide a performance improvement. However, the power will also increase. Because placed design 700 meets both performance and power requirements, step 125 will indicate that all criteria are met. In step 150, the placement is finalized and the netlist and placement information are output. What results is the placed, optimized design (step 160).

Figure 8:
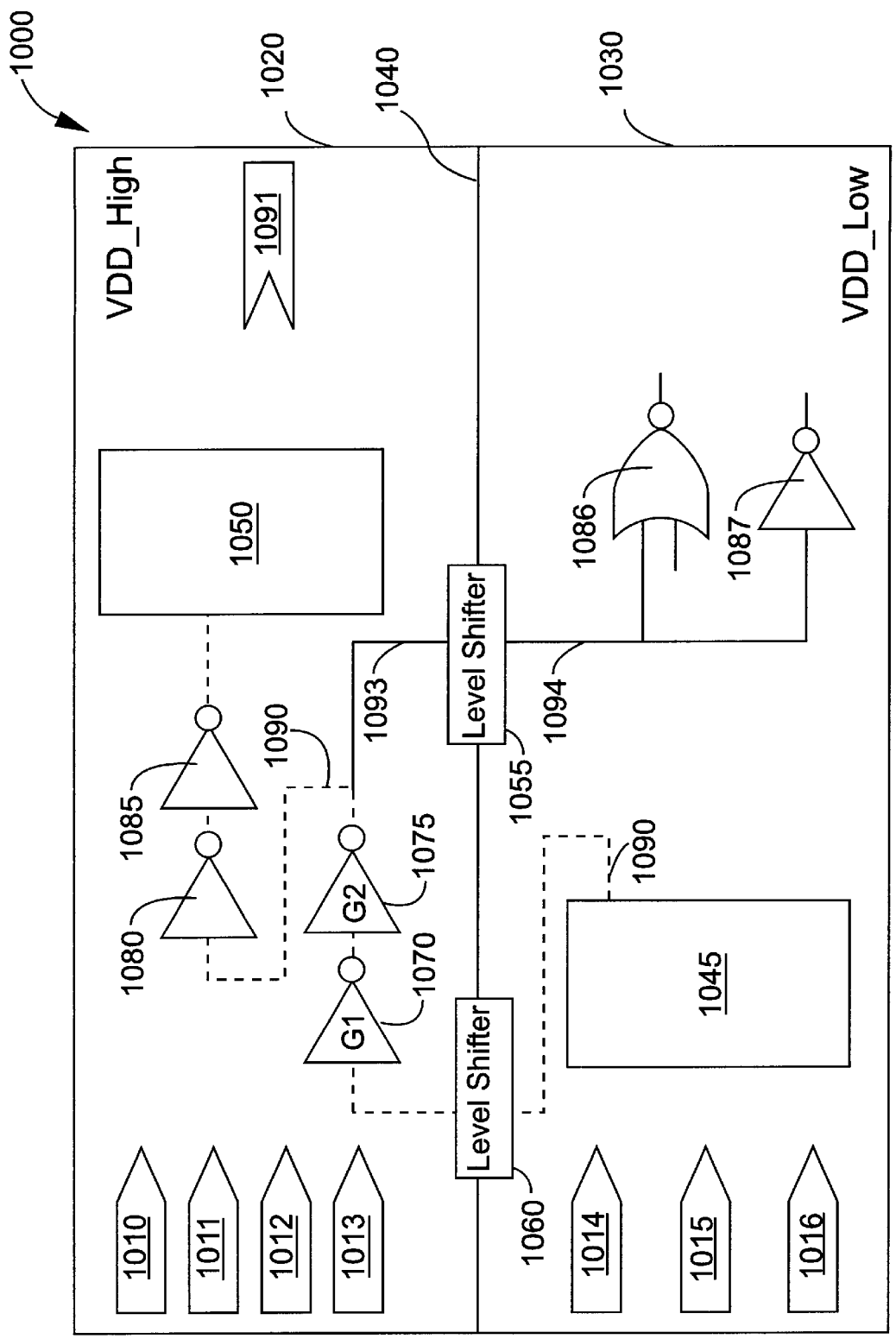
FIGS. 8 and 9 are examples of power reduction steps taken by a preferred embodiment of the present invention on an exemplary placement.
Figure 9:
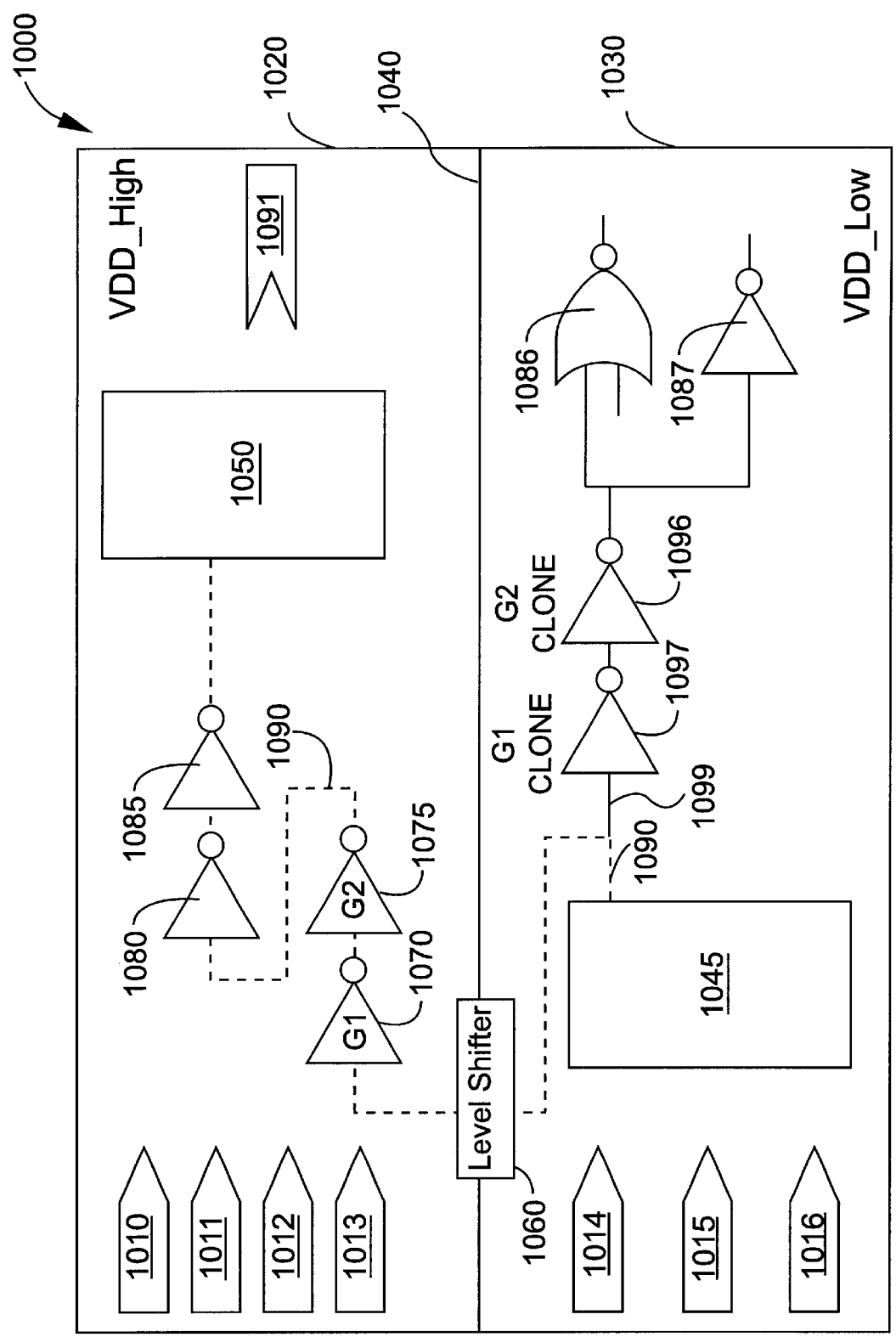

Methods 100 and 145 may also include normal synthesis operations such as cloning and buffering in order to further reduce power. FIGS. 8 and 9 illustrate a cloning operation performed during method 145 to reduce power (by minimizing wire length and eliminating a level shifter). In FIG. 8, a partially placed design 1000 comprises a high voltage bin 1020 separated from a low voltage bin 1030 by boundary 1040. On boundary 1040 are two level shifters 1055 and 1060. Level shifter 1060 shifts voltage from the lower voltage of bin 1030 to the higher voltage of bin 1020, while level shifter 1055 does the reverse. Depending on the technology being implemented, level shifter 1055 may not be needed. For the particular technology being used in FIG. 8, level shifter 1055 is used. Path 1090 was a critical path that has been made to meet timing requirements in FIG. 8.

High voltage bin 1020 comprises inputs 1010 through 1013, inverters 1070, 1075, 1080, and 1085, logic block 1050, and output 1091. Low voltage bin 1030 comprises inputs 1014 through 1016, logic block 1045, NOR gate 1086 and inverter 1087. When method 145 runs on the partially placed design 1000, it is determined that the wire length happens to be high (particularly the nets 1093 and 1094) and level shifter 1055 may be removed. To support this, inverter G1 1070 and inverter G2 1075 are cloned to become inverter G1 Clone 1097 and inverter G2 Clone 1096 (see FIG. 9). This reduces line length as the line length is now net 1091. Additionally, as level shifter 1055 is no longer needed, the number of level shifters are reduced.

The previous methods were described using PDS, or placement driven synthesis. There are other placement tools and methods. The present invention is applicable to any placement environment that proceeds through successive refinement of the locations of the circuits on the design and in which the placement process may be interrupted to make changes in placement of the logic. The following discussion centers on a placement tool and methodology that is a simulated annealing placer. As stated in the Overview section, such a placement tool operates by analogy with the physical annealing of a crystal, melting many trial changes to the placement.

Figure 10:
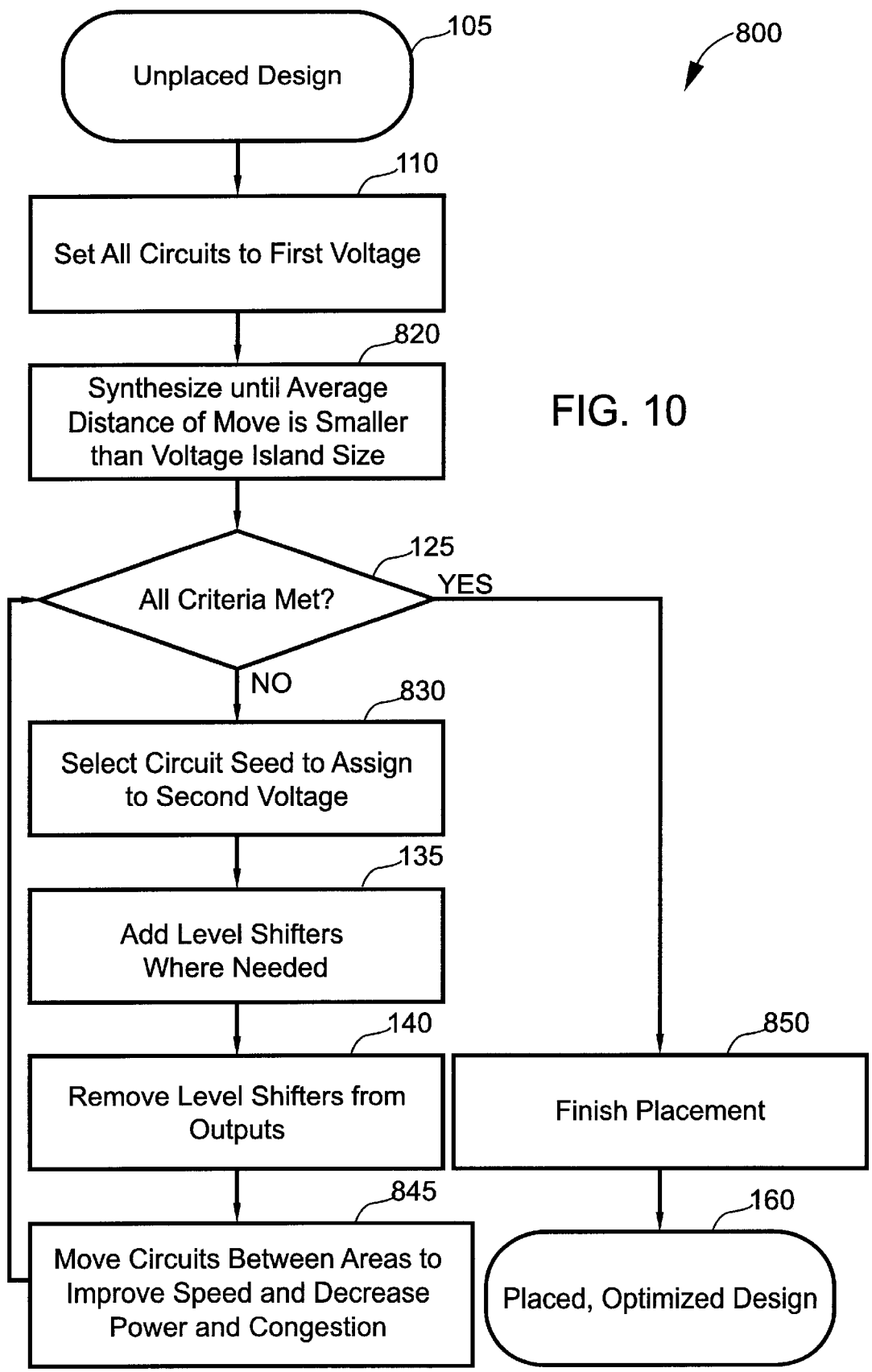
FIGS. 10 and 11 are flow charts of a second preferred method in accordance with a preferred embodiment of the present invention.

Turning now to FIG. 10, this figure shows a method 800 for concurrent logical and physical construction of voltage islands using a simulated annealing placer. As method 800 is very similar to method 100, generally only differences will be discussed herein while referring to method 800. During this discussion, it may be beneficial to refer to FIG. 1 for comparison.

One difference between the two methods is in step 820 of method 800. A PDS system, such as that used for method 100, divides the chip design into areas called bins. A simulated annealing placement system does not use bins. In step 820, instead of partitioning the chip design and performing synthesis actions on the design, the normal annealing placement process is performed until the average distance that circuits are being moved is smaller than the smallest recommended voltage island size. This allows the normal annealing placement process to finish prior to adding the concurrent logic and physical construction of voltage islands.

In step 830, a circuit is selected as a "seed" circuit. As previously discussed, it is preferable to initially set all circuits to low voltage. The seed circuit is then assigned to high voltage and a high voltage island is created around the seed circuit. The size of the high voltage island can increase or decrease depending on the number of circuits in the island. It is possible to preferentially choose, as the seed circuit, a circuit that is close to an existing high voltage island. Therefore, moving the seed circuit physically adjacent to the existing high voltage island will increase the size of the existing high voltage island. Thus, instead of having bins where the entire bin is selected as a voltage island, method 800 selects a circuit and creates the voltage island around the circuit.

Figure 11:
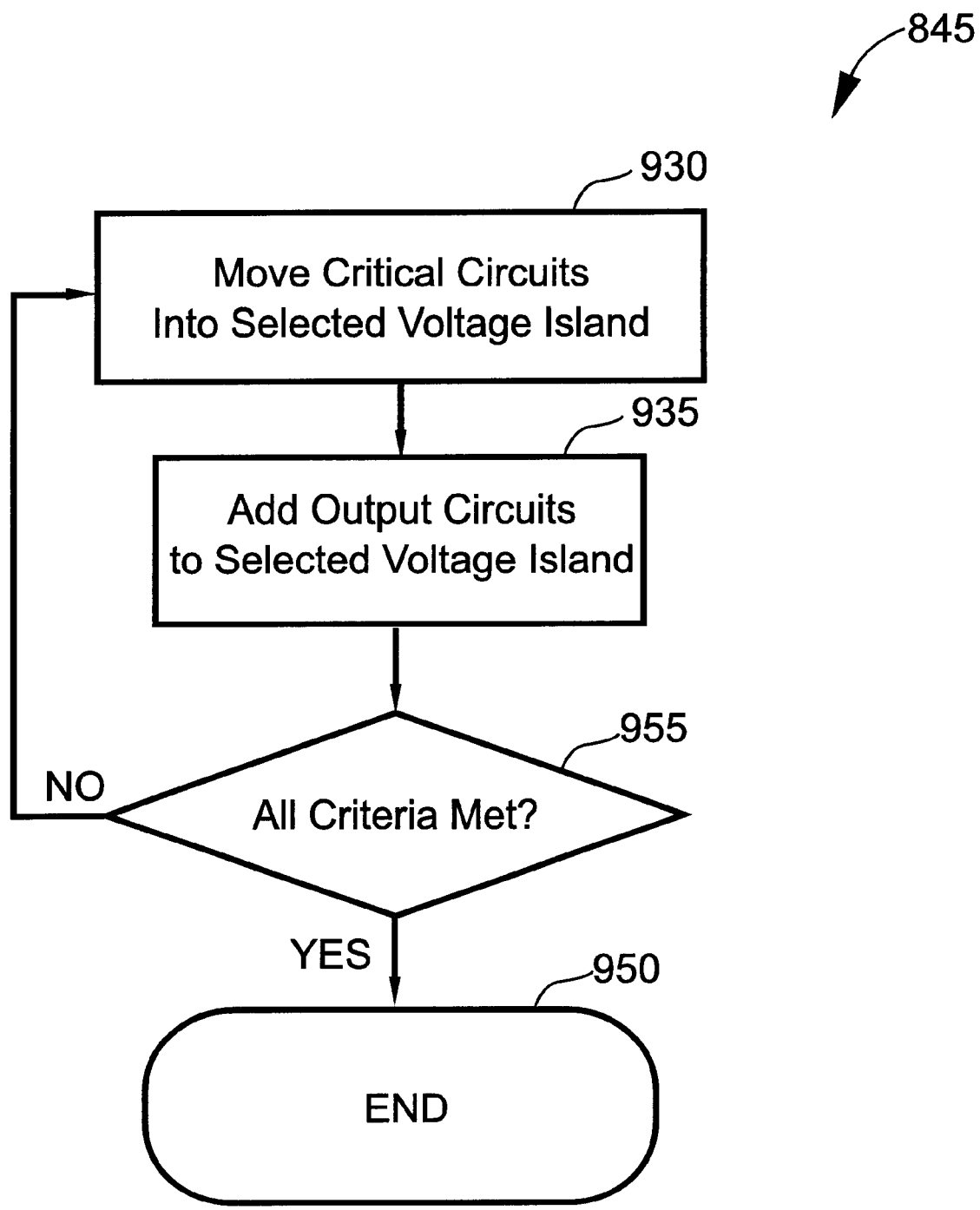

In step 845, circuits are moved between areas (between islands) to improve speed and decrease power and congestion. Step 845 is disclosed more particularly in FIG. 11 as method 845, and is similar to steps 230 through 255 of FIG. 2. For step 930, critical circuits in low voltage islands that feed critical circuits in the selected island are moved into the selected island. If necessary, the island's size is increased. Thus, if the critical circuits and paths in the selected island are still not meeting timing limitations, the circuits feeding these critical circuits are moved from low power to high power. This should speed the critical paths and improve timing. Level shifters, if any, will be moved from the outputs of the newly added circuits to the inputs of the newly added circuits.

In step 935, if the island containing the selected seed circuit falls below minimum capacity, then low voltage circuits fed by outputs of the critical circuits in the selected island will be added to the selected island. Circuits to be moved in this manner would preferentially be chosen to minimize the number of level shifter additions required. Step 940 attempts to keep the critical nets at the fastest speed by adding circuitry fed by the critical nets to the higher voltage island. Thus, when the selected island's size becomes small, the circuits that are fed by critical nets and that are in lower power islands are added to the higher power selected island, and the non-critical circuits are removed from the selected island.

Additionally, in step 935, it may be necessary to make room in adjacent islands for circuits being moved out of the selected island. To allow this to happen, low voltage circuits fed by outputs of the critical circuits in the selected island will be added to the selected island. Again, circuits to move in this manner would preferentially be chosen to minimize the number of such level shifter additions required.

In step 955, it is determined as to whether all criteria are met for this island. Such criteria will primarily be performance and power criteria, according to the performance and power criteria set for the chip design. Additionally, other criteria may be checked, such as over- or under-capacity, routing or location specifications, etc. If all criteria are not met (step 955=NO), method 845 is performed again; if all criteria are met (step 955=YES), the method ends in step 950. It should be noted that even though performance and power criteria could be met prior to step 955, method 945 may be performed multiple times to reduce power to the maximum extent while still meeting the other criteria. The lowest power configuration that meets the other criteria (and, in particular, the performance criteria) would then be the best solution.

It should also be noted that step 955 may entail adding additional circuits to the island if the island is less than a preferred capacity. If steps 930 and 935 do not add enough circuits to the island (either because the critical input cone is small or because the circuit movement required to achieve physical adjacency violates other constraints), other nearby critical circuits may be selected, assigned to high voltage, and moved into the island. Steps 930 and 935 can then be continued on the inputs and outputs of the newly added circuits.

Note that, as discussed in reference to method 145 of FIG. 2, other actions may be taken to meet predetermined criteria in step 845. For instance, buffering or cloning may be used to improve speed, decrease power and/or decrease congestion. As further examples, the following optimizations (discussed in reference to method 145) may also be used in step 845: high switching circuits may be moved out of high voltage islands and into low voltage islands to decrease power; if a voltage island becomes too small, circuits in a surrounding, low voltage island that are fed by critical paths or nets in a selected high voltage island may be moved into the high voltage island (improves speed); circuits may be moved into a selected voltage island based on minimizing level shifters.

In step 850 of FIG. 10, changes are disallowed that will cause the high voltage islands already defined to become physically disconnected. The finishing placement process continues, but with the rule that no changes can create physical disconnection between high voltage islands. The exact X,Y placement of circuits within voltage islands is also determined in this step.

Method 800 and 845 are equally applicable to selecting a seed for a low voltage island. In this case, non-critical nets and circuits are added to the low voltage island and critical nets and circuits are transferred to the high voltage island.

In summary, the method of providing both logical and physical construction of voltage islands is adaptable to a variety of placement algorithms. In accordance with the method, a voltage island is chosen and circuits are added or removed to the island to best analyze design criteria. The two primary criteria are power and performance criteria. Logical construction of the islands occurs because the logical structure is maintained within the island and on surrounding islands. The physical construction occurs because circuits are moved into (and out of) a physical voltage island. The best placement occurs when the logical relationship of the circuits and the physical voltage layout combine to increase performance where necessary and to decrease power where necessary. The iterative nature of the method makes finding this combination relatively easy.

What has been shown are methods that provide both logical and physical construction of voltage islands. The preferred embodiments of the present invention combine both physical and logical synthesis to provide fewer level shifters and less power routing, but still meet timing and other requirements. Additionally, by using an iterative process for construction of the voltage islands, power usage can be minimized while speed constraints, in particular, are met.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Similarly, unless otherwise specified, any sequence of steps of the method indicated in the drawings or in the text is given as an example of a possible sequence and not as a limitation. Many modifications and variations are possible in light of the above teaching without departing from the spirit and scope of the forthcoming claims.

What is claimed is:

1. A method of placing circuits on an integrated circuit comprising the steps of:
developing a first integrated circuit floor plan configuration;
assigning a set of circuits to a first of a plurality of voltage levels;
partitioning the set of circuits into a plurality of bins;
assigning one of the bins to a second of the plurality of voltage levels;
assigning circuits within the one bin to the second voltage level based on physical and logical evaluation criteria;
repeating the following additional steps until an integrated circuit floor plan satisfying a predetermined criteria is achieved:
assigning a second circuit bin from the plurality of circuit bins to the second voltage level;
assigning circuits within the second circuit bin to the second voltage level; and
transferring at least one circuit between a bin assigned to the second voltage level and a bin assigned to the first voltage level.

2. The method of claim 1 wherein the second voltage level is greater than the first voltage level.

3. The method of claim 2 wherein the step of assigning one of the bins to a second of the plurality of voltage levels comprises the steps of determining a worst slack path in the set of circuits and assigning a bin having at least one circuit in the worst slack path as the one bin.

4. The method of claim 2 wherein the step of assigning one of the bins to a second of the plurality of voltage levels comprises the steps of determining a plurality of critical paths; determining an amount of delay improvement for each bin having circuits in the critical paths if the circuits in each bin are assigned to the second voltage; determining a bin having a largest delay improvement to at least one of the critical paths if circuits in this bin are assigned to the second voltage level; and assigning this bin as the one bin.

5. The method of claim 1 wherein the second voltage level is less than the first voltage level.

6. The method of claim 1 wherein the step of assigning one of the bins to a second of the plurality of voltage levels comprises the steps of determining a bin that has a predetermined amount of inputs directly feeding latches and assigning this bin as the one bin.

7. A method of placing circuits on an integrated circuit comprising the steps of:
assigning a set of circuits to a first of a plurality of voltage levels;
partitioning the set of circuits into a plurality of bins;
assigning one of the bins to a second of the plurality of voltage levels;
assigning circuits within the one bin to the second voltage level based on physical and logical evaluation criteria;

making the second voltage level greater than the first voltage level; and assigning a bin having a predetermined number of low switching circuits as the one bin.

8. A method of placing circuits on an integrate circuit comprising the steps of:

assigning a set of circuits to a first of a plurality of voltage levels;

partitioning the set of circuits into a plurality of bins;

assigning one of the bins to a second of the plurality of voltage levels;

assigning circuits within the one bin to the second voltage level based on physical and logical evaluation criteria;

making the second voltage level less than the first voltage level; and assigning a bin having a predetermined number of high switching circuits as the one bin.

9. A method of placing circuits on an integrated circuit comprising the steps of:

assigning a set of circuits to a first of plurality of voltage levels;

partitioning the set of circuits into a plurality of bins;

assigning one of the bins to a second of the plurality of voltage levels;

assigning circuits within the one bin to the second voltage level based on physical and logical evaluation criteria;

making the second voltage level less than the first voltage level; and assigning a random bin as the one bin.

10. A method of placing circuits on an integrated circuit comprising the steps of:

assigning a set of circuits to a first of a plurality of voltage levels;

partitioning the set of circuits into a plurality of bins;

assigning one of the bins to a second of the plurality of voltage levels;

assigning circuits within the one bin to the second voltage level based on physical and logical evaluation criteria;

making the second voltage level greater than the first voltage level; and determining a location where many late paths converge and assigning a bin having the location as the one bin.

11. A method of placing circuits on an integrated circuit comprising the steps of:

assigning a set of circuits to a first of a plurality of voltage levels;

partitioning the set of circuits into a plurality of bins;

assigning one of the bins to a second of the plurality of voltage levels;

assigning circuits within the one bin to the second voltage level based on physical and logical evaluation criteria;

iterating, until predetermined criteria are met, the steps of:
assigning an additional bin to the second voltage level;
assigning circuits within the additional bin to the second voltage level; and
moving at least one circuit between a bin assigned to the second voltage level and a bin assigned to the first voltage level.

12. The method of claim 11 wherein the step of moving at least one circuit between a bin assigned to the second voltage level and a bin assigned to the first voltage level comprises the step of moving at least one circuit from a bin assigned to the second voltage level to a bin assigned to the first voltage level.

13. The method of claim 12 wherein the second voltage level is greater than the first voltage level, wherein the step of moving at least one circuit from a bin assigned to the second voltage level to a bin assigned to the first voltage level comprises the step of moving at least one high switching circuit from the second voltage level to the first voltage level, and wherein the at least one high switching circuit is moved only if it is in a non-critical path.

14. The method of claim 11 wherein the step of moving at least one circuit between a bin assigned to the second voltage level and a bin assigned to the first voltage level comprises the step of moving at least one circuit from a bin assigned to the second voltage level to a bin assigned to the first voltage level.

15. The method of claim 11 wherein the predetermined criteria comprise minimizing power subject to a performance constraint.

16. The method of claim 11 wherein the predetermined criteria comprise maximizing performance subject to a power constraint.

17. The method of claim 11 wherein the step of moving at least one circuit between a bin assigned to the second voltage level and a bin assigned to the first voltage level comprises the step of selecting the at least one circuit based on criteria of minimizing level shifters.

18. The method of claim 11 wherein the step of moving at least one circuit between a bin assigned to the sand voltage level and a bin assigned to the fast voltage level causes a first bin assigned to the second voltage level to meet a predetermined minimum size.

19. The method of claim 18 wherein the second voltage level is greater than the first voltage level, and wherein the step of moving at least one circuit between a bin assigned to the second voltage level and a bin assigned to the first voltage level further comprises the step of moving at least one low switching circuit from a surrounding bin assigned to the first voltage level into the first bin.

20. The method of claim 18 wherein the second voltage level is greater than the first voltage level, and wherein the step of moving at least one circuit between a bin assigned to the second voltage level and a bin assigned to the first voltage level further comprises the step of moving at least one surrounding circuit into the first bin, the at least one surrounding circuit being in a surrounding bin assigned to the first voltage level and being fed by critical paths in the first bin.

21. The method of claim 18 wherein the step of moving at least one circuit between a bin assigned to the second voltage level and a bin assigned to the first voltage level comprises the step of selecting the at least one circuit based on criteria a of minimizing level shifts.

22. The method of claim 11 wherein the step of moving at least one circuit between a bin assigned to the second voltage level and a bin assigned to the first voltage level comprises the step of buffering at least one circuit.

23. The method of claim 11 wherein the step of moving at least one circuit between a bin assigned to the second voltage level and a bin assigned to the first voltage level comprises the step of cloning at least one circuit.

24. A method of placing circuits on an integrated circuit comprising the steps of:

assigning a set of circuits to a first of a plurality of voltage levels;

partitioning the set of circuits into a plurality of bins;

assigning one of the bins to a second of the plurality of voltage levels;

assigning circuits within the one bin to the second voltage level based on physical and logical evaluation criteria; and adding a level shifter to an input of one of the circuits within the one bin, wherein the input crosses a boundary separating the one bin from an adjacent bin that is assigned to the first voltage level.

25. A method performed on a design for a semiconductor chip for placing circuits on an integrated circuit, the method comprising the steps of:
assigning a set of circuits to a first of a plurality of voltage levels;
selecting a seed circuit from the set of circuits;
assigning the seed circuit to a second of the plurality of voltage levels; and
creating a voltage island around the seed circuit.

26. The method of claim 25 wherein the second voltage level is greater than the first voltage level.

27. The method of claim 25 wherein the second voltage level is less than the first voltage level.

28. The method of claim 25 further comprising the steps of creating a first voltage island around some of the set of circuits that are assigned to the first voltage level and moving at least one circuit between the first voltage island and the voltage island around the seed circuit, hereinafter known as the second voltage island, in order to meet predetermined criteria.

29. The method of claim 28 wherein the step of moving at least one circuit between the first voltage island and the second voltage island in order to meet predetermined criteria comprises the step of buffering the at least one circuit.

30. The method of claim 28 wherein the step of moving at least one circuit between the first voltage island and the second voltage island in order to meet predetermined criteria comprises the step of cloning the at least one circuit.

31. The method of claim 28 wherein the second voltage is higher than the first voltage, wherein the at least one circuit is a high switching circuit that is non-critical, and wherein the at least one circuit is moved from the second voltage island to the first voltage island.

32. The method of claim 28 wherein the predetermined criteria comprise minimizing power subject to a performance constraint.

33. The method of claim 28 wherein the predetermined criteria comprise maximizing performance subject to a power constraint.

34. The meth of claim 28 wherein the at least one circuit is moved from the first voltage island into second voltage island, wherein the second voltage is higher than the first voltage, and wherein the at least one circuit is a critical circuit.

35. The method of claim 28 further comprising the step of iterating, until the predetermined criteria arm met, the steps of selecting a seed circuit from the set of circuits, assigning the seed circuit to a second of the plurality of voltage levels, creating a second voltage island around the seed circuit, and moving at least one circuit between the first voltage island and the second voltage island in order to meet predetermined criteria.

36. The method of claim 35 wherein one of the seed circuits is selected next to an existing voltage island assigned to the second voltage level, wherein an additional voltage island is created around the one seed circuit, and wherein the additional and existing voltage islands are merged to create a larger voltage island.

37. The method of claim 35 wherein the step of iterating causes one of the second voltage islands to fall beneath a minimum capacity.

38. The method of claim 37 wherein the second voltage is higher than the first voltage, and wherein the method further comprises the step of moving an adjacent critical circuits into the one voltage island.

39. The method of claim 37 wherein the second voltage is higher than the first voltage, and wherein the method further comprises the step of moving an adjacent low switching circuit into the one voltage island.

40. A program product comprising:
(A) a computer program including a integrated circuit design tool, the integrated circuit design tool developing a first integrated circuit floor plan configuration; assigning a set of circuits to a first of a plurality of voltage levels; partitioning the set of circuits into a plurality of bins; assigning one of the bins to a second of the plurality of voltage levels; and assigning circuits within the one bin to the second voltage level based on physical and logical evaluation criteria; repeating the following additional steps until an integrated circuit floor plan satisfying a predetermined criteria is achieved; assigning a second circuit bin from the plurality of circuit bins to the second voltage level; assigning circuits within the second circuit bin to the second voltage level; transferring at least one circuit between a bin assigned to the second voltage level and a bin assigned to the first voltage level; and
(B) signal bearing media bearing the computer program.

41. The program product of claim 40 wherein the signal bearing media comprises recordable media.

42. The program product of claim 40 wherein the signal bearing media comprises transmission media.

43. The program product of claim 40 wherein the integrated circuit design tool assigns one of the bins to a second of the plurality of voltage levels by determining a bin that has a predetermined amount of inputs directly feeding latches and assigning this bin as the one bin.

44. A program product comprising:
(A) a computer program including a integrated circuit design tool, the integrated circuit design tool assigning a set of circuits to a first of a plurality of voltage levels; partitioning the set of circuits into a plurality of bins; assigning one of the bins to a second of the plurality of voltage levels; assigning circuits within the one bin to the second voltage level based on physical and logical evaluation criteria; making the second voltage level greater than the first voltage level; and
(B) signal bearing media bearing he computer program.

45. The program product of claim 44 wherein the integrated circuit design tool assigns one of the bins to a second of the plurality of voltage levels by determining a worst slack path in the set of circuits and assigning a bin having at least one circuit in the worst slack path as the one bin.

46. The program product of claim 44 wherein the integrated circuit design tool assigns one of the bins to a second of the plurality of voltage levels by assigning a bin having a predetermined number of low switching circuits as the one bin.

47. The program product claim 44 wherein the integrated circuit design tool assigns one of the bins to a second of the plurality of voltage levels by determining a location where many late paths converge and assigning a bin having the location as the one bin.

48. The program product claim 44 wherein the integrated circuit design tool assigns one of the bins to a second of the plurality of voltage levels by determining a plurality critical paths; determining an amount of delay improvement for each bin having circuits in the critical paths if the circuits in each bin are assigned to the second voltage; determining a bin having a largest delay improvement to at least one of the critical paths if circuits in this bin are assigned to the second voltage level; and assigning this bin as the one bin.

49. A program product comprising:
(A) a computer including a integrated circuit design tool, the integrated circuit design tool assigning a set of circuits to a plurality of a plurality of voltage levels; partitioning the set of circuits into a plurality of bins; assigning one of the bins to a second of the plurality of voltage levels; assigning circuits within the one bin to the second voltage level based on physical and logical evaluation criteria; making the second voltage level less than the first voltage level; and
(B) signal bearing media bearing the computer program.

50. The program product of claim 49 wherein the integrated circuit design tool assigns one of the bins to a second of the plurality of voltage levels by assigning a bin having a predetermined number of high switching circuits as the one bin.

51. A program product comprising:
(A) a computer program including a integrated circuit design tool, the integrated circuit design tool assigning a set of circuits to a first of a plurality of voltage levels; partitioning the set of circuits into a plurality of bins; assigning one of the bins to a second of the plurality of voltage levels; assigning in circuits within the one bin to the second voltage level based on physical and logical evaluation criteria; assigning one of the bins to a second of the plurality of voltage levels by assigning a random bin as the one bin; and
(B) signal bearing media bearing the computer program.

52. A program product comprising:
(A) a computer program including a integrated circuit design tool, the integrated circuit design tool assigning a set of circuits to a first of a plurality of voltage levels; partitioning the set of circuits into a plurality of bins; assigning one of the bins to a second of the plurality of voltage levels; assigning circuits within the one bin to the second voltage level based on physical and logical evaluation criteria; assigning an additional bin to the second voltage level, assigns circuits within the additional bin to the second voltage level, and moves at least one circuit between a bin assigned to the second voltage level and a bin assigned to the first voltage level until predetermined criteria are met; and
(B) signal bearing media bearing the computer program.

53. The program product of claim 52 wherein the integrated circuit design tool moves at least one circuit between a bin assigned to the second voltage level and a bin assigned to the first voltage level by moving at least one circuit from a bin assigned to the second voltage level to a bin assigned to the first voltage level.

54. The program product of claim 52 wherein the integrated circuit design tool moves at least one circuit between a bin assigned to the second voltage level and a bin assigned to the first voltage level by moving at least one circuit from a bin assigned to the second voltage level to a bin assigned to the first voltage level.

55. The program product of claim 52 wherein the predetermined criteria comprise minimizing power subject to a performance constraint.

56. The program product of claim 52 wherein the predetermined criteria comprise maximizing performance subject to a power constraint.

57. The program product of claim 52 wherein the integrated circuit design tool moves at least one circuit between a bin assigned to the second voltage level and a bin assigned to the first voltage level by selecting the at least one circuit based on criteria of minimizing level shifters.

58. The program product of claim 52 wherein the integrated circuit design tool moves at least one circuit between a bin assigned to the second voltage level and a bin assigned to the first voltage level to cause a first bin assigned to the second voltage level to meet a predetermined minimum size.

59. The program product of claim 58 wherein the second voltage level is greater than the first voltage level, and wherein the integrated circuit design tool moves at least one circuit between a bin assigned to the second voltage level and a bin assigned to the first voltage level further by moving at least one low switching circuit from a surrounding bin assigned to the first voltage level into the first bin.

60. The program product of claim 58 wherein the second voltage level is greater than the first voltage level, and wherein the integrated circuit design tool moves at least one circuit between a bin assigned to the second voltage level and a bin assigned to the first voltage level further by moving at least one surrounding circuit into the first bin, the at least one surrounding circuit being in a surrounding bin assigned to the first voltage level and being fed by critical paths in the first bin.

61. The program product of claim 58 wherein the integrated circuit design tool moves at least one circuit between a bin assigned to the second voltage level and a bin assigned to the first voltage level comprises the step of selecting the at least one circuit based on criteria of miming level shifters.

* * * * *